(12) United States Patent
Mikawa et al.

(10) Patent No.: US 8,384,061 B2
(45) Date of Patent: Feb. 26, 2013

(54) NONVOLATILE MEMORY DEVICE AND MANUFACTURING METHOD

(75) Inventors: Takumi Mikawa, Shiga (JP); Kenji Tominaga, Kyoto (JP); Kazuhiko Shimakawa, Osaka (JP); Ryotaro Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 12/745,190

(22) PCT Filed: Nov. 6, 2008

(86) PCT No.: PCT/JP2008/003214
§ 371 (c)(1),
(2), (4) Date: May 27, 2010

(87) PCT Pub. No.: WO2009/069252
PCT Pub. Date: Jun. 4, 2009

(65) Prior Publication Data
US 2010/0258779 A1    Oct. 14, 2010

(30) Foreign Application Priority Data

Nov. 29, 2007 (JP) ................................. 2007-308469

(51) Int. Cl.
*H01L 27/26* (2006.01)
*H01L 29/8605* (2006.01)
*H01L 21/02* (2006.01)

(52) U.S. Cl. ............. 257/4; 257/2; 257/5; 257/E21.006; 257/E27.07; 257/E45.003; 438/382; 365/148

(58) Field of Classification Search .................. 257/2–5, 257/E21.006, E27.002, E27.07, E45.001, 257/E45.002, E45.003; 365/174, 175, 186, 105, 148; 438/100–104, 382
See application file for complete search history.

(56) References Cited

U.S. PATENT DOCUMENTS

| | | | |
|---|---|---|---|
| 6,185,122 B1 | 2/2001 | Johnson et al. | |
| 6,717,222 B2* | 4/2004 | Zhang | 257/390 |
| 6,879,508 B2 | 4/2005 | Tran | |
| 7,079,442 B2* | 7/2006 | Rinerson et al. | 365/230.06 |
| 7,391,045 B2* | 6/2008 | Lowrey | 257/5 |

(Continued)

FOREIGN PATENT DOCUMENTS

| | | |
|---|---|---|
| JP | 2003-068984 | 3/2003 |
| JP | 2004-031914 | 1/2004 |

(Continued)

*Primary Examiner* — Steven J Fulk
*Assistant Examiner* — Eric Ward
(74) *Attorney, Agent, or Firm* — McDermott Will & Emery LLP

(57) ABSTRACT

A nonvolatile memory device of the present invention includes a substrate (1), first wires (3), first resistance variable elements (5) and lower electrodes (6) of first diode elements which are filled in first through-holes (4), respectively, second wires (11) which cross the first wires 3 perpendicularly to the first wires 3, respectively, and each of which includes a semiconductor layer (7) of a first diode elements, a conductive layer (8) and a semiconductor layer (10) of a second diode elements which are stacked together in this order, second resistance variable elements (16) and upper electrodes (14) of second diode elements which are filled into second through holes (13), respectively, and third wires (17), and the conductive layer (8) of each second wires (11) also serves as the upper electrode of the first diode elements (9) and the lower electrode of the second diode elements (15).

10 Claims, 10 Drawing Sheets

U.S. PATENT DOCUMENTS

| | | | |
|---|---|---|---|
| 7,755,093 B2 * | 7/2010 | Ohara | 257/74 |
| 7,807,995 B2 * | 10/2010 | Mikawa et al. | 257/43 |
| 7,915,656 B2 * | 3/2011 | Mikawa et al. | 257/296 |
| 8,198,618 B2 * | 6/2012 | Mikawa et al. | 257/2 |
| 8,227,788 B2 * | 7/2012 | Mikawa et al. | 257/4 |
| 8,253,136 B2 * | 8/2012 | Mikawa et al. | 257/43 |
| 2003/0003674 A1 | 1/2003 | Hsu et al. | |
| 2003/0174530 A1 | 9/2003 | Tran | |
| 2004/0090809 A1 | 5/2004 | Tran | |
| 2005/0211978 A1 | 9/2005 | Bu et al. | |
| 2005/0212022 A1 | 9/2005 | Greer et al. | |
| 2005/0230724 A1 | 10/2005 | Hsu | |
| 2005/0242386 A1 * | 11/2005 | Ang | 257/306 |
| 2006/0098472 A1 | 5/2006 | Ahn et al. | |
| 2006/0154432 A1 | 7/2006 | Arai et al. | |
| 2006/0197115 A1 * | 9/2006 | Toda | 257/248 |
| 2006/0203541 A1 | 9/2006 | Toda | |
| 2006/0250836 A1 * | 11/2006 | Herner et al. | 365/148 |
| 2007/0009201 A1 | 1/2007 | Chandross et al. | |
| 2007/0009821 A1 | 1/2007 | Cutler et al. | |
| 2007/0132049 A1 | 6/2007 | Stipe | |
| 2007/0184613 A1 | 8/2007 | Kim et al. | |
| 2007/0285969 A1 | 12/2007 | Toda et al. | |
| 2007/0285970 A1 | 12/2007 | Toda et al. | |
| 2007/0285971 A1 | 12/2007 | Toda et al. | |
| 2008/0105878 A1 | 5/2008 | Ohara | |
| 2008/0112211 A1 | 5/2008 | Toda | |
| 2008/0121865 A1 | 5/2008 | Ahn et al. | |
| 2008/0304308 A1 | 12/2008 | Stipe | |
| 2009/0085025 A1 | 4/2009 | Arai et al. | |
| 2010/0032641 A1 | 2/2010 | Mikawa et al. | |

FOREIGN PATENT DOCUMENTS

| | | |
|---|---|---|
| JP | 2005-307191 | 11/2005 |
| JP | 2005-311322 | 11/2005 |
| JP | 2006-514392 | 4/2006 |
| JP | 2006-140489 | 6/2006 |
| JP | 2007-027717 | 2/2007 |
| JP | 2007-165873 | 6/2007 |
| JP | 2007-214565 | 8/2007 |
| JP | 2008-118022 | 5/2008 |
| WO | WO 2004/027877 A1 | 4/2004 |
| WO | WO 2007/102341 A1 | 9/2007 |
| WO | WO 2008/062688 A1 | 5/2008 |

* cited by examiner

NONVOLATILE MEMORY DEVICE AND MANUFACTURING METHOD

RELATED APPLICATIONS

This application is the U.S. National Phase under 35 U.S.C. §371 of International Application No. PCT/JP2008/03214, filed on Nov. 6, 2008, which in turn claims the benefit of Japanese Application No. 2007-308469, filed on Nov. 29, 2007, the disclosures of which Applications are incorporated by reference herein.

TECHNICAL FIELD

The present invention relates to a cross-point nonvolatile memory device incorporating a resistance variable layer. Particularly, the present invention relates to a configuration in which diodes are integrated into wiring layers.

BACKGROUND ART

In recent years, with advancement of digital technologies of electronic hardware, memory devices which have a large capacity and are nonvolatile have been developed vigorously to store data of music, image, information and so on. For example, nonvolatile memory devices which are represented by a flash memory have been already used in many fields. However, it is said that miniaturization of the flash memory has almost reached a limit. As memories which are usable in behalf of the flash memory, various memories such as a phase change random access memory (PCRAM), a MRAM, and a FeRAM have been developed. Among them, a ReRAM using a material which is adapted to switch its resistance value in response to electric pulses applied and retains the states has attracted an attention because of its high compatibility with a standard semiconductor process and high adaptability for miniaturization.

For example, a cross-point ReRAM which is aimed at miniaturization and a larger capacity is disclosed (e.g., see Patent document 1). In this ReRAM, stripe-shaped lower electrodes are formed on a substrate and an active layer is formed to cover the entire surfaces of the lower electrodes. As the active layer, a resistance variable layer which switches its resistance reversibly in response to electric pulses is used. On the active layer, stripe-shaped upper electrodes are formed to cross the lower electrodes perpendicularly to the lower electrodes, respectively. A region where the lower electrode crosses the upper electrode with the active layer sandwiched between them is a memory section. Each lower electrode and each upper electrode serves as either a word line or a bit line. It is described that such a cross-point configuration can achieve a larger capacity.

In the cross-point ReRAM, a diode is incorporated to be arranged in series with a resistance variable layer to avoid an influence of resistance variable layers belonging to other rows or columns, when reading a resistance value of the resistance variable layer formed at a cross point.

For example, a ReRAM is disclosed, comprising a substrate including two or more bit lines arranged in parallel with each other, two or more word lines which are arranged in parallel with each other so as to cross the bit lines, respectively, resistive structures formed on the bit lines at positions where the bit lines cross the word lines, respectively, and diode structures formed on the resistive structures in contact with the resistive structures and the word lines, lower electrodes formed on the substrate, resistive structures formed on the lower electrodes, diode structures formed on the resistive structures, and upper electrodes formed on the diode structures (see Patent document 2).

In such a configuration, a unit cell structure can be formed to have a stacked structure including a single diode structure and a single resistive structure which are stacked together continuously, and an array cell structure is easily attained.

As an example of sharing wires, a cross-point MRAM is disclosed, in which a word line is shared and diode elements and MTJ elements are symmetrically arranged on and below the wire, respectively (e.g., see patent document 3). In this configuration, platinum is used for the wire and silicon is provided on and below the wire, thereby fabricating Schottky diodes.

Patent document 1: Japanese Laid-Open Patent Application Publication No. 2003-68984
Patent document 2: Japanese Laid-Open Patent Application Publication No. 2006-140489
Patent document 3: U.S. Pat. No. 6,879,508 Specification

DISCLOSURE OF THE INVENTION

Problems to be Solved by the Invention

Patent document 1 discloses the cross-point configuration, but fails to disclose or suggest series connection of the diode or its specific structure.

In contrast to the above, Patent document 2 discloses a configuration in which the resistive structures are formed on the lower electrodes, the diode structures are formed on the resistive structures, the upper electrodes are formed on the diode structures, and each diode structure is formed of a p-type oxide and a n-type oxide which are made of NiO, $TiO_2$, and the like. However, since the diode structures disclosed in Patent document 2 are equal in outer dimension to the resistive structures, it is difficult to increase a current supply capability of the diode structures. If the current supply capability of a diode is small, the diode is incapable of flowing a current sufficient to perform writing, which impedes a stable operation of the ReRAM.

Patent document 3 discloses a configuration in which upper and lower memory cells share the wire and the Schottky diodes are formed by upper and lower interfaces with the wire. However, the Schottky diodes are capable of flowing a current only unidirectionally. A diode is required to flow a current bidirectionally when it is incorporated into a ReRAM including as an element layer a resistance variable layer which switches its resistance with response to voltages with different polarities If a MSM diode capable of flowing a current bidirectionally is used, constituents forming the element increase, and a manufacturing method thereof is complicated. Patent document 3 fails to disclose or suggest the associated problem and a specific structure of the element.

Prior to conceiving the present invention, we proposed a cross-point structure for making an effective area of a diode element larger than the area of a resistive element by incorporating a portion of the diode element into an upper wire of a cross point (Japanese Patent Application No. 2006-312590), and achieved a ReRAM which is capable of ensuring a sufficient current supply capability and is operable stably in a cross-point configuration including a combination of the diode element and the resistance variable layer.

Although in this structure, the diode element is integrated into a part of the wire structure, the constituents of the cross-point memory cell are still many, if a suitable conductive material is individually selected for an electrode material of the resistance variable layer, an electrode material of the diode and a wire material. When the constituents of the cross-point memory cell are more, a manufacturing method thereof becomes more complicated and miniaturization is more difficult.

The present invention is directed to solving the above described new problem, and an object of the present invention is to provide a nonvolatile memory device which can ensure a sufficient current supply capability in a cross-point configuration having a combination of a diode element and a resistance variable layer, can be manufactured more easily and is adapted for miniaturization by using a common electrode of diode elements of upper and lower memory cells for a wire in an even-numbered layer, by making use of a feature of a hierarchical bit line architecture.

Means for Solving the Problem

To achieve the above described object, a nonvolatile memory device of the present invention comprises a substrate; a plurality of first wires which are formed on the substrate to extend in parallel with each other; a first interlayer insulating layer formed over the substrate and the first wires; first memory cell holes which are formed in the first interlayer insulating layer on the first wires; first resistance variable layers which are formed inside the first memory cell holes, respectively and are connected to the first wires, respectively; lower electrodes of first diode elements which are formed inside the first memory cell holes, respectively and are formed on the first resistance variable layers, respectively; a plurality of second wires which are formed on the first interlayer insulating layer to extend in parallel with each other such that the second wires cover upper surfaces of the lower electrodes, respectively and cross the first wires perpendicularly to the first wires, respectively, each of the plurality of second wires including a plurality of layers stacked to have a semiconductor layer of each of the first diode elements, a conductive layer and a semiconductor layer of each of second diode elements which are stacked together in this order; a second interlayer insulating layer formed over the second wires and the first interlayer insulating layer; second memory cell holes penetrating the second interlayer insulating layer on the second wires; upper electrodes of the second diode elements which are formed inside the second memory cell holes, respectively, and are connected to the second wires, respectively; second resistance variable layers which are formed inside the second memory cell holes, respectively and are connected to upper electrodes of the second diode elements, respectively; and a plurality of third wires which are formed on the second interlayer insulating layer to extend in parallel with each other such that the third wires cover upper surfaces of the second resistance variable layers, respectively and cross the second wires perpendicularly to the second wires, respectively.

A nonvolatile memory device of the present invention comprises a substrate; a plurality of first wires which are formed on the substrate to extend in parallel with each other in a first direction; a first interlayer insulating layer formed over the substrate and the plurality of first wires; a plurality of second wires which are formed on the first interlayer insulating layer to extend in parallel with each other in a second direction crossing the first direction when viewed in a thickness direction of the first interlayer insulating layer; a second interlayer insulating layer which is formed over the first interlayer insulating layer and the plurality of second wires; and a plurality of third wires which are formed on the second interlayer insulating layer to extend in parallel with each other in a third direction crossing the second direction when viewed in a thickness direction of the second interlayer insulating layer; a plurality of first through-holes are formed to penetrate the first interlayer insulating layer at three-dimensional cross points of the first wires and the second wires, respectively; a plurality of second through-holes are formed to penetrate the second interlayer insulating layer at three-dimensional cross points of the second wires and the third wires, respectively; each of the second wires has a stacked structure including a first semiconductor layer, a conductive layer and a second semiconductor layer which are stacked together in this order; each of first nonvolatile memory elements includes a first resistance variable layer and a first electrode layer which are stacked together in this order on the first wires inside associated one of the first through-holes; and each of second nonvolatile memory elements includes a second electrode layer and a second resistance variable layer which are stacked together in this order on the second wires inside associated one of the second through-holes.

In the above configuration, the conductive layer of second wires can serve as the upper electrodes of first diode elements, the lower electrodes of second diode elements, and the conductive layer of wire layer which is its original role. In a conventional configuration, the upper electrodes and lower electrodes of first diode elements, and the upper electrodes and lower electrodes of second diode elements, i.e., four electrodes in total are required. In contract, in the structure of the present invention, these upper and lower electrodes are reduced to one electrode in the wire layer, except for the electrode of the resistance variable element which is also used as the electrode of the diode element. Therefore, the number of process steps and hence the process cost can be reduced.

The contact surface of the semiconductor layer of first diode element and the conductive layer which are in contact is larger in size than the lower electrode defining the area of the first diode element. Likewise, the contact surface of the semiconductor layer of second diode element and the conductive layer which are in contact is larger in size than the upper electrode defining the area of the second diode element. Since a current flows outside the region defined by each electrode in the interface between the semiconductor layer and the conductive layer, the current supply capability of each diode element can be improved. Therefore, it is possible to achieve a nonvolatile memory device which can ensure a sufficient current supply capability in a cross-point configuration having a combination of the diode element and the resistance variable element and which can be manufactured more easily and enable miniaturization by using the common electrode for the diode elements of the upper and lower memory cells.

In the above nonvolatile memory device, entire openings at both ends of each of the first through-holes may be covered with the first wires and the second wires, respectively, and entire openings at both ends of each of the second through-holes may be covered with the second wires and the third wires, respectively.

The above nonvolatile memory device may further comprise a plurality of constituent units being stacked together, each of the constituent units including the plurality of first wires, the first interlayer insulating layer, the first nonvolatile memory elements, the plurality of second wires, the second interlayer insulating layer and the first nonvolatile memory elements.

In such a configuration, for example, in a four-layer cross-point memory structure, the wire layers having a diode function are reduced to two layers, while in an eight-layer cross-point memory structure, the wire layers having a diode function are reduced to four layers. In other words, in a multi-layer structure, the wire layers having a diode function can be reduced to about a half. The wire layers used in a standard LSI process may be used as the remaining wires. Therefore, it is possible to achieve a nonvolatile memory device which can ensure a sufficient current supply capability in a cross-point configuration having a combination of the diode element and the resistance variable layer, and has a large capacity without making the process step complicated and increasing the process cost.

In the nonvolatile memory device, a longitudinal length of each of the second wires may be shorter than at least one of a longitudinal length of each of the first wires and a longitudinal length of each of the third wires.

In such a configuration, an electrode material which is suitable for a diode function may be selected flexibly even from materials with high resistivities. By reducing the length of the second wires, it is possible to prevent a delay of a signal in a wire between a circuit for driving a cross-point memory and the memory cell, or deficiency of voltages applied to the memory cell which would otherwise occur due to wire resistance.

In the nonvolatile memory device, a thickness of each of the second wires may be smaller than at least one of a thickness of each of the first wires and a thickness of each of the third wires.

In such a configuration, the electrode material which is suitable for a diode function can be selected flexibly even from materials which are processed and polished with difficulty. By reducing the thickness of the second wires, patterning by processing and polishing is easily carried out, and the memory cell can be further miniaturized.

In the nonvolatile memory device, at least one of an electric resistivity of a material forming the first wires and an electric resistivity of a material forming the third wires may be lower than an electric resistivity of a material forming the second wires.

In such a configuration, since wire layers having a diode function and the second wires can be reduced to a common constituent, the wire layers having a conductivity with a lower resistance are used for the first and third wires which need not be electrodes of the diodes. Thereby, it is possible to prevent a delay of a signal in a wire between a circuit for driving a cross-point memory and a memory cell, or deficiency of voltages applied to the memory cell which would otherwise occur due to wire resistance. In addition, it is possible to achieve a high-speed operation of the memory.

In the nonvolatile memory device including the constituent units being stacked, the plurality of first wires and the plurality of third wires have a word line function (a decoder is connected to the word lines which activate memory cells and enable writing and reading and selects a word line (applies voltages to it), and thereby the memory cell connected to the word line is activated). The plurality of second wires have a bit line function (a sense amplifier is connected to the bit lines to enable writing and reading of data with respect to the memory cells, and amplifies a bit line potential, and data is processed as digital signal). The second wires respectively belonging to the constituent units may overlap with each other when viewed in the thickness direction, second wires which belong to (even-number)-th constituent units from the substrate and overlap with each other when viewed in the thickness direction may be electrically connected to each other, and second wires which belong to (odd-number)-th constituent units from the substrate and overlap with each other when viewed in the thickness direction may be electrically connected to each other.

In such a configuration, the memory cells are arranged at cross points between the bit lines extending in X-direction and formed in a plurality of layers and the word lines each of which extends in Y-direction and is formed in a layer between the bit lines. A plurality of basic array planes including common word lines are arranged in Y-direction for each group of bit lines aligned in Z-direction (thickness direction). In other words, a multi-layer cross-point structure is attained. In the respective basic array planes, the bit lines in the even-numbered layer in the stacked structure are connected to each other and the bit lines in the odd-numbered layer in the stacked structure are connected to each other. By combining select switch elements with the bit lines in the even-numbered layer which are connected to each other and with the bit lines in the odd-numbered layer which are connected to each other, respectively, switching between electric connection and disconnection to a global bit line connected to the select switches is controlled. Thus, a hierarchical bit line architecture is achieved. This makes it possible to reduce an array size while minimizing an increase in a layout area.

A method of manufacturing a nonvolatile memory device of the present invention, comprises the steps of: forming a plurality of first wires on a substrate such that the first wires extend in parallel with each other; forming a first interlayer insulating layer over the substrate and the first wires; forming first memory cell holes on the first wires and in predetermined positions of the first interlayer insulating layer, respectively; filling first resistance variable layers into the first memory cell holes, respectively; filling lower electrodes of first diode elements onto the first resistance variable layers inside the first memory cell holes, respectively; forming a plurality of second wires on the first interlayer insulating layer such that the second wires extend in parallel with each other, cover upper surfaces of the lower electrodes, respectively and cross the first wires perpendicularly to the first wires, respectively, each of the plurality of second wires including a plurality of layers stacked to have a semiconductor layer of each of first diode elements, a conductive layer, and a semiconductor layer of each of second diode elements which are stacked together in this order; forming a second interlayer insulating layer over the second wires and the first interlayer insulating layer; forming second memory cell holes on the second wires and in predetermined positions of the second interlayer insulating layer, respectively; filling upper electrodes of the second diode elements into the second memory cell holes, respectively; filling second resistance variable layers onto the upper electrodes inside the second memory cell holes, respectively; and forming a plurality of third wires on the second interlayer insulating layer such that the third wires extend in parallel with each other, cover upper surfaces of the second resistance variable layers, respectively and cross the second wires perpendicularly to the second wires, respectively.

A method of manufacturing a nonvolatile memory device of the present invention comprises the steps of: forming a plurality of first wires on a substrate such that the first wires extend in parallel with each other in a first direction; forming a first interlayer insulating layer over the substrate and the plurality of first wires; forming a plurality of first through-holes on the first wires, respectively such that the first through-holes penetrate the first interlayer insulating layer and are arranged at predetermined intervals; filling first resistance variable layers and first electrode layers into the first through-holes, respectively such that the first resistance variable layer and the first electrode layer are stacked in this order on each of the first wires; forming a plurality of second wires on the first interlayer insulating layer such that the second wires extend in parallel with each other in a second direction crossing the first direction when viewed in a thickness direction of the first interlayer insulating layer and cover entire upper end surfaces of the first electrode layers, respectively, each of the plurality of second wires including a first semiconductor layer, a conductive layer, and a second semiconductor layer which are stacked together in this order; forming a second interlayer insulating layer over the first interlayer insulating layer and the plurality of second wires; forming a plurality of second through-holes on the second wires, respectively such that the second through-holes penetrate the second interlayer insulating layer and are arranged at predetermined intervals; filling second resistance variable layers and second electrode layers into the second through-holes, respectively such that the second resistance variable layer and the second electrode layer are stacked in this order on each of the second wires; and forming a plurality of third wires on the second interlayer insulating layer such that the third wires extend in parallel with each other in a third direction crossing the second direction when viewed in a thickness direction of the second interlayer insulating layer and cover entire upper end surfaces of the second electrode layers, respectively.

In such a configuration, the semiconductor layer of first diode elements, the upper electrodes of first diode elements, the lower electrodes of second diode elements and the conductive layer of wire layer which is its original role, and the semiconductor layer of second diode elements can be formed all together. With the above manufacturing method, it is possible to achieve a nonvolatile memory device which can ensure a sufficient current supply capability in a cross-point configuration having a combination of a diode elements and a resistance variable layer and which is adapted for miniaturization by using a common electrode for diode elements of upper and lower memory cells.

In the above manufacturing method, the step for forming the first wires may be performed by a damascene process in which wire material is filled into predetermined trenches by a CMP process after forming the trenches in the first interlayer insulating layer, and the step for forming the second wires may be performed in such a manner that the first semiconductor layer, the conductive layer and the second semiconductor layer are etched using a mask after the first semiconductor layer, the conductive layer and the second semiconductor layer are stacked together in this order; and the step for forming the third wires may be performed by a damascene process in which wire material is filled into predetermined trenches by a CMP process after forming the trenches in the second interlayer insulating layer.

In such a manufacturing method, the second wires having a diode function and having a stacked structure can be formed by etching suitable for processing the stacked structure. Also, the first and third wires which are desirably made of a wire material with a low conductivity can be formed by a damascene process used for wires in a LSI process adapted for standard miniaturization. In other words, by selecting a desired manufacturing method according to a purpose, a nonvolatile memory device which is adapted for miniaturization is achieved.

The above and further objects, features and advantages of the present invention will more fully be apparent from the following detailed description of preferred embodiments with accompanying drawings.

Effects of the Invention

The present invention can ensure a sufficient current supply capability in a cross-point configuration having a combination of diode elements and a resistance variable layer with the above configuration. The present invention has a great advantage that a nonvolatile memory device which can be easily manufactured and is adapted for miniaturization by using a common electrode of diode elements of upper and lower memory cells for wires in an even-numbered layers in a stacked structure is achieved, by making use of a feature of a hierarchical bit line architecture.

BRIEF DESCRIPTION OF THE DRAWINGS

FIG. 9(b) is a view showing a step for forming a second interlayer insulating layer, FIG. 9(c) is a view showing a step for forming second through-holes, and FIG. 9(d) is a view showing a step for filling second electrode layers into the second through-holes, respectively.

FIG. 10 is a process step cross-sectional view for explaining a second manufacturing method of the cross-point memory having a two-layer structure according to Embodiment 1 of the present invention, in which FIG. 10(a) is a view showing a step for filling second resistance variable layers into the second through-holes, respectively, FIG. 10(b) is a view showing a step for forming holes into which first lead-out contact plugs are filled, respectively after a third interlayer insulating layer is formed, FIG. 10(c) is a view showing a step for forming trenches into which third wires and first lead-out wires are filled, and FIG. 10(d) is a view showing a step for forming the third wires, the first lead-out contact plugs and the first lead-out wires by a damascene process.

Figure 1:
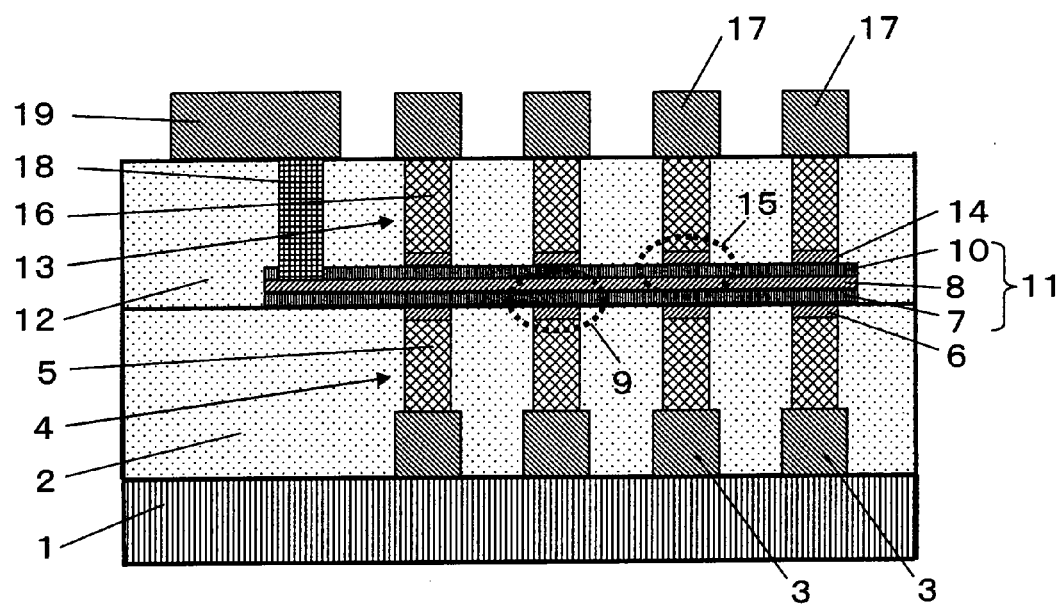
FIG. 1 is a cross-sectional view of a structure of a cross-point memory having a two-layer structure according to Embodiment 1 of the present invention.

EXPLANATION OF REFERENCE NUMERALS 1 substrate
2 first interlayer insulating layer
2A first interlayer insulating layer (lower layer side)
2B first interlayer insulating layer (upper layer side)
3 first wires
3A trenches into which first wires will be filled
4 first through-holes
5 first resistance variable layer
6 first electrode layer
7 first semiconductor layer
8 conductive layer
9 first diode elements (MSM diodes)
10 second semiconductor layer
11 second wires
12 second interlayer insulating layer
13 second through-holes
14 second electrode layer
15 second diode elements (MSM diodes)
16 second resistance variable layer
17 third wires
17A trenches into which third wires will be filled
18 first lead-out contact plugs
18A holes into which first lead-out contact plugs will be filled
19 first lead-out wires
19A trench into which first lead-out wires will be filled
20 third interlayer insulating layer
20A third interlayer insulating layer (lower layer side)
21 third through-holes
22 third resistance variable layer
23 third electrode layer
24 third semiconductor layer
25 conductive layer
26 third diode elements (MSM diodes)
27 fourth semiconductor layer
28 fourth wires
29 fourth interlayer insulating layer
30 fourth through-holes
31 fourth electrode layer
32 fourth diode elements (MSM diodes)
33 fourth resistance variable layer
34 fifth wires
35 second lead-out contact plugs
36 second lead-out wires
37 sixth wires
38 seventh wires
39 eighth wires
40 ninth wires
41 select switch
42 select switch
43 global bit line

BEST MODE FOR CARRYING OUT THE INVENTION

Hereinafter, embodiments of the present invention will be described with reference to the drawings. Throughout the drawings, the same or corresponding constituents are designated by the same reference numerals and description thereof will be omitted in some cases. It should be noted that the shapes of the memory sections and the like are schematically shown, and the number of them are set for easier illustration.

(Embodiment 1)

FIG. 1 is a cross-sectional view of an exemplary schematic configuration of a cross-point nonvolatile memory device having a two-layer structure according to Embodiment 1 of the present invention, as viewed from the side. The nonvolatile memory device of this Embodiment includes a substrate 1, first wires 3 of a stripe shape which are formed on the substrate 1, a first interlayer insulating layer 2 formed over the substrate 1 to cover the first wires 3, second wires 11 of a stripe shape which are formed on the first interlayer insulating layer 2 such that the second wires 11 respectively cross the first wires 3 perpendicularly to the first wires 3, a second interlayer insulating layer 12 formed over the first interlayer insulating layer 3 to cover the second wires 11, and third wires 17 of a stripe shape which are formed on the second interlayer insulating layer 12.

To be more specific, the nonvolatile memory device of this Embodiment includes the substrate 1, the plurality of first wires 3 which are formed on the substrate 1 to form a first flat plane parallel to a main surface of the substrate 1 and respectively extend in parallel with each other in a first direction, a first interlayer insulating layer 2 which is formed over the substrate 1 and the plurality of first wires 3 (to cover them) such that its upper surface is parallel to the main surface of the substrate 1, the plurality of second wires 11 which are formed on the first interlayer insulating layer 2 to form a second flat plane parallel to the first flat plane and respectively extend in parallel with each other in a second direction crossing the first direction (perpendicularly to the first direction in the example of FIG. 1) when viewed in the thickness direction of the first interlayer insulating layer 2, the second interlayer insulating layer 12 which is formed over the first interlayer insulating layer 2 and the plurality of second wires 11 (to cover them) such that its upper surface is parallel to the main surface of the substrate 1, and a plurality of third wires 17 which are formed on the second interlayer insulating layer 12 to form a third flat plane parallel to the second flat plane and extend in parallel with each other in a third direction crossing (perpendicularly to the second direction in the example of FIG. 1) the second direction when viewed in the thickness direction (thickness direction of the first interlayer insulating layer 2) of the second interlayer insulating layer 12. The first wires 3 and the second wires 11 three-dimensionally cross each other, and the second wires 11 and the third wires 17 three-dimensionally cross each other.

Each second wire 11 includes a first semiconductor layer 7 (semiconductor layer of first diode elements), a conductive layer 8 and a second semiconductor layer 10 (semiconductor layer of second diode elements) which are stacked together in this order. The first semiconductor layer 7, the conductive layer 8 and the second semiconductor layer have the same shape when viewed in the thickness direction (direction in which these layers are stacked together, hereinafter the same applies). The first semiconductor layer 7 is configured to connect a plurality of first through-holes 4. The second semiconductor layer 10 is configured to connect a plurality of second through-holes 13.

The first through-holes 4 (memory cell holes) are formed in regions (three-dimensional cross-points) where the first wires 3 three-dimensionally cross the second wires 11, respectively such that the first through-holes 4 penetrates the first interlayer insulating layer 2. The first wires 3 are exposed inside each first through-hole 4. The first resistance variable layer 5 and the first electrode layer 6 (lower electrodes of first diode elements 9) are filled into each first through-hole 4 such that the first resistance variable layer 5 and the first electrode layer 6 are stacked together in this order on the exposed first wires 3. In such a configuration, the first resistance variable layer 5 and the first electrode layer 6 electrically connect the first wires 3 to the second wires 11. In the example of FIG. 1, the first wires 3 are configured to physically (directly) contact the first resistance variable layer 5, the first resistance variable layer 5 is configured to physically (directly) contact the first electrode layer 6, and the first electrode layer 6 is configured to physically (directly) contact the second wires 11 (first semiconductor layer 7).

The second through-holes 13 (memory cell holes) are formed in regions (three-dimensional cross-points) where the second wires 11 three-dimensionally cross the third wires 17, respectively such that the second through-holes 13 penetrate the second interlayer insulating layer 12. The second wires 11 are exposed inside each second through-holes 13. The second electrode layer 14 (upper electrodes of second diode elements 15) and the second resistance variable layer 16 are filled into each second through-holes 13 such that the second electrode layer 14 and the second resistance variable layer 16 are stacked together in this order on the exposed second wires 11. In such a configuration, the second electrode layer 14 and the first resistance variable layer 16 electrically connect the second wires 11 to the third wires 17. In the example of FIG. 1, the second wires 11 (second semiconductor layer 10) is configured to physically (directly) contact the second electrode layer 14, the second electrode layer 14 is configured to physically (directly) contact the second resistance variable layer 16, and the second resistance variable layer 16 is configured to physically (directly) contact the third wires 17.

A first resistance variable elements are composed of a region of the first wires 3 which cover the entire surface of lower openings of each first through-holes 4 and substantially conform to the lower openings of the first through-holes 4 when viewed in the thickness direction, and the first resistance variable layer 5 and first electrode layer 6 which are filled into the first through-holes 4. That is, the first resistance variable element has a structure in which the first resistance variable layer 5 is sandwiched between the first wires 3 and the first electrode layer 6.

A second resistance variable element is composed of the second electrode layer 14 and the second resistance variable layer 16 which are filled into each second through-holes 13, and a region of the third wires 17 which cover the entire surface of the upper openings of the second through-holes 13 and substantially conforms to the upper openings of the second through-holes 13 when viewed in the thickness direction. That is, the second resistance variable element has a structure in which the second resistance variable layer 16 is sandwiched between the second electrode layer 14 and the third wires 17.

Each of the first resistance variable elements and the second resistance variable elements has a characteristic in which a resistance value between the both electrodes switches on application of predetermined currents or voltages between the electrodes (electrode layer and wires). The resistance value is retained after the application of the currents or voltages stops. With such a characteristic, the first resistance variable elements and the second resistance variable elements are used as nonvolatile memory elements for storing digital data.

Each of first diode elements 9 (MSM diode) is composed of the first electrode layer 6 formed inside each first through-hole 4, a region of the first semiconductor layer 7 which covers the entire surfaces of the upper openings of the first through-holes 4 and substantially conforms to the upper openings of the first through-holes 4 when viewed in the thickness direction, and a region of the conductive layer 8 which is included in the second wires 11 covering the entire surfaces of the upper openings of the first through-holes 4 and which substantially conforms to the upper openings of the first through-holes 4 when viewed in the thickness direction. That is, each of the first diode elements 9 has a structure in which the first semiconductor layer 7 is sandwiched between the first electrode layer 6 and the conductive layer 8.

Each of second diode elements 15 (MSM diode) is composed of a region of the conductive layer 8 which is included in the second wires 11 covering the entire surfaces of the lower openings of each second through-holes 13 and substantially conforms to the upper openings of the second through-holes 13 when viewed in the thickness direction, a region of the second semiconductor layer 10 which covers the entire surfaces of the lower openings of the second through-holes 13 and which substantially conforms to the lower openings of the second through-holes 13 when viewed in the thickness direction, and the second electrode layer 14 formed inside the second through-holes 13. In other words, the second diode element 15 has a structure in which the second semiconductor layer 10 is sandwiched between the conductive layer 8 and the second electrode layer 14.

The conductive layer 8 serves as the upper electrode of the first diode elements 9, the lower electrode of the second diode elements 15, and the conductive layer of the second wires 11. The first diode elements 9 and the second diode elements 15 are vertically symmetric with respect to the second wires 11. The second wires 11 are connected to a first lead-out wires 19 via a first lead-out contact plugs 18 penetrating the second interlayer insulating layer 12. That is, the conductive layer 8 of the second wires 11 is electrically connected to the first lead-out wires 19 via a first lead-out contact plugs 18 penetrating the second interlayer insulating layer 12 and the second semiconductor layer 10.

The diode elements can suppress a leak current (cross leak) flowing through adjacent memory cells (each consisting of one resistance variable element and one diode element). In addition, the Schottky diode can increase a current supply capability of a memory cell because major carriers are dominant and enables the memory cell to operate at a high-speed. Furthermore, desirably, the first resistance variable elements and the second resistance variable elements are vertically symmetric with respect to the second wires 11, because the second wires also serves as the bit line for the upper and lower memory cells.

The diode element is meant to include general diode elements (elements which have a characteristic in which they exhibit a non-linear current property with respect to voltages with a unidirectional polarity but do not substantially flow a current with respect to voltages with an opposite polarity) or bidirectional current controlling elements (elements which exhibit a non-linear current property with respect to positive and negative voltages, bidirectional diodes). As used herein, the non-linear current property means that the resistance value is larger in a range (low-voltage range) in which an absolute value of the voltage is small and is smaller in a range (high-voltage range) in which an absolute value of the voltage is large.

The electrode materials of first diode elements 9 and the second diode elements (materials of the conductive layer 8 and/or the first electrode layer 6 and/or the second electrode layer 10) may comprise tantalum, tantalum nitride, titanium, titanium nitride, aluminum, tungsten, platinum, copper, or a combination of these. The first semiconductor layer 7 and the second semiconductor layer 10 may comprise silicon, silicon nitride, or silicon carbide.

With such a MSM diode configuration, it is possible to easily attain a diode element which has a large bidirectional current supply capability and has a characteristic with a less variation, even when it is used with so-called a bipolar (bipolar-drivable) resistance variable layer which switches its resistance in response to positive and negative voltages applied.

As the first interlayer insulating layer 2 and the second interlayer insulating layer 12, insulative oxide materials may be used. To be specific, silicon oxide (SiO) deposited by the CVD process, or a TEOS-SiO layer deposited using ozone ($O_3$) and tetraethoxysilane (TEOS) by the CVD process, or a silicon nitride (SiN) layer may be used. Alternatively, silicon carbon nitride (SiCN) layer or silicon oxycarbite (SiOC) layer which is a low dielectric constant material, fluorine-doped silicon oxide (SiOF) layer, etc may be used. It is preferable that the thickness of the first interlayer insulating layer 2 and the thickness of the second interlayer insulating layer 12 are about 100~500 nm. This is because as an inter-wire insulating layer is thinner, an inter-wire leak current increases, while as the inter-wire insulating layer is thicker, the first through-holes 4 and the second through-holes 13 are deeper and it is difficult to process them.

The first resistance variable layer 5 and the second resistance variable layer 16 may comprise transition metal oxides, for example, iron-containing oxide such as triiron tetraoxide ($Fe_3O_4$), titanium oxide, tantalum oxide, vanadium oxide, cobalt oxide, nickel oxide, zinc oxide, or niobium oxide layer, by the sputtering process or the like. Such transition metal oxide materials are allowed to exhibit a specific resistance value switching when they are applied with voltages or currents which are not lower than thresholds and retains the resistance value until it is newly applied with pulse voltages or pulse currents having specified magnitudes. Although in this Embodiment, the first resistance variable layer is filled into the through-holes, it may be formed on only a bottom portion or side walls of the through-holes, for example.

The first lead-out contact plugs 18 may be made of tungsten or copper. Or, the first lead-out contact plugs 18 may have a two-layer structure, in which the upper layer comprises tungsten or copper, and the lower layer comprises titanium, titanium nitride, tantalum and tantalum nitride or a combination of these. This can achieve lead-out contacts with a low contact resistance. The first lead-out contact plugs 18 penetrate the semiconductor layer 10 and physically (directly) contact the conductive layer 8 of the second wires. This is because, metal-metal junction is produced by excluding the second semiconductor layer 10 which easily forms a Schottky contact, thereby forming an ohmic contact, and preventing the contact from failing to function.

Figure 2:
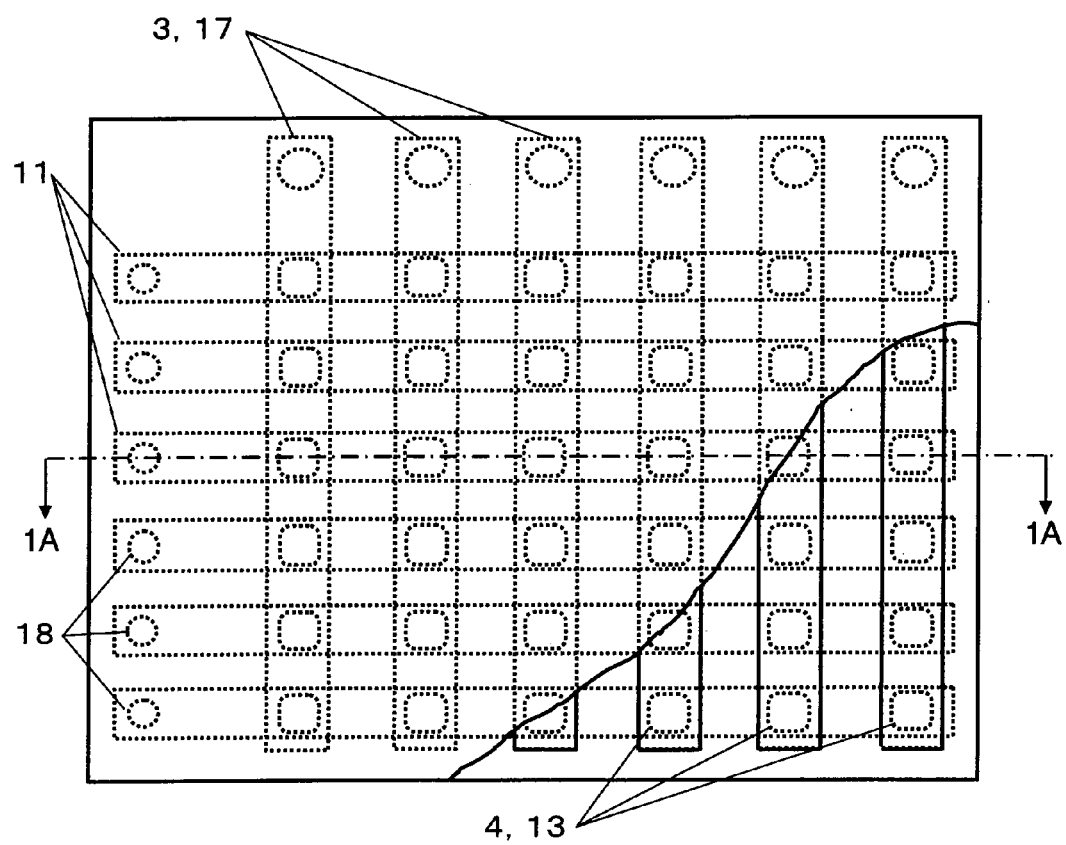
FIG. 2 is a plan view of a cross-point memory having a two-layer structure according to Embodiment 1 of the present invention.

FIG. 2 is a plan view of a cross-point memory having a two-layer structure according to Embodiment 1 of the present invention. FIG. 2 shows a configuration produced on assumption that an insulating layer covers the second interlayer insulating layer 12 and the third wires 17, and a part of it is removed.

As shown in FIG. 2, the first wires 3 and the second wires 11 cover the entire openings of the first through-holes 4 and are larger in size than the openings of the first through-holes 4 (protrude outward over the openings) when viewed in the thickness direction (from above the substrate 1). Likewise, the second wires 11 and the third wires 17 cover the entire openings of the second through-holes 13 and are larger in size than the openings of the second through-holes 13 (protrudes outward over the openings). The detail is as follows.

The width (width in a rightward and leftward direction in FIG. 2: lateral width with the longitudinal direction of the first wires 3 being a forward and rearward direction) of the first wires 3 is larger than the width (width in a rightward and leftward direction in FIG. 2: lateral width with the longitudinal direction of the first wires 3 being a forward and rearward direction) of the lower openings of the first through-holes 4. Thus, the first wires 3 cover the entire lower openings of the first through-holes 4 and protrudes outward over the lower openings.

The width (width in an upward and downward direction in FIG. 2: lateral width with the longitudinal direction of the second wires 11 being a forward and rearward direction) of the second wires 11 (first semiconductor layer 7) is larger than the width (width in an upward and downward direction in FIG. 2: lateral width with the longitudinal direction of the second wires 11 being a forward and rearward direction) of the upper openings of the first through-holes 4. Thus, the second wires 11 (first semiconductor layer 7) cover the entire upper openings of the first through-holes 4 and protrudes outward over the upper openings. In such a configuration, the lower electrode area of the first diode element 9 is maximized and a current supply capability of the first diode element 9 is improved.

The width (width in an upward and downward direction in FIG. 2: lateral width with the longitudinal direction of the second wires 11 being a forward and rearward direction) of the second wires 11 (second semiconductor layer 10) is larger than the width (width in an upward and downward direction in FIG. 2: lateral width with the longitudinal direction of the second wires 11 being a forward and rearward direction) of the lower openings of the second through-holes 13. Thus, the second wires 11 (second semiconductor layer 10) cover the entire lower openings of the second through-holes 13 and protrudes outward over the lower openings. In such a configuration, the upper electrode area of the second diode element 15 is maximized and a current supply capability of the second diode element 15 is improved.

The width (width in a rightward and leftward direction in FIG. 2: lateral width with the longitudinal direction of the third wires 15 being a forward and rearward direction) of the third wire 17 is larger than the width (width in a rightward and leftward direction in FIG. 2: lateral width with the longitudinal direction of the third wire 17 being a forward and rearward direction) of the upper openings of the second through-holes 13. Thus, the third wires 17 cover the entire upper openings of the second through-holes 13 and protrudes outward over the upper openings.

In the above configuration, the conductive layer 8 of second wires can serve as the upper electrode of first diodes, the lower electrode of second diodes, and the conductive layer of wire layer which is its original role. When the first resistance variable elements, the first diode elements (MSM diodes), the second wires, the second diode elements (MSM diodes), and the second resistance variable elements are stacked together in this order, nine electrode layers in total, which are two electrode layers for the first resistance variable elements, two electrode layers for the first diode elements, one electrode layer (conductor layer) for the second wire layer, two electrode layers for the second diode elements and two electrode layers for the second resistance variable layer, are generally required, as the electrode layers (or conductor layers). In this Embodiment, these nine electrode layers can be reduced to five electrode layers. Thus, in the nonvolatile memory device of this Embodiment, the number of process steps forming the electrode layers can be reduced and the process cost can be reduced.

The contact surface of the semiconductor layer 7 of first diode elements and the conductive layer 8 which are in contact is larger in size than the contact area of the lower electrodes 6 (defining the area of the first diode elements) and the semiconductor layer 7. Likewise, the contact surface of the semiconductor layer 10 of second diode elements and the conductive layer 8 which are in contact is larger in size than the contact area of the upper electrodes 14 defining the area of the second diode elements and the semiconductor layer 10. Since a current flows outside the region defined by each electrode in the interface between the semiconductor layer and the conductive layer, the current supply capability of each diode element can be improved. Therefore, it is possible to achieve a nonvolatile memory device which can ensure a sufficient current supply capability in a cross-point configuration having a combination of the diode elements and the resistance variable layer and which can be manufactured more easily and enable miniaturization by using the common electrode for the diode elements of the upper and lower memory cells.

[Modification]

In the above configuration, the longitudinal length (e.g., 5 μm) of the second wires 11 is desirably set shorter than the longitudinal length (e.g., 150 μm) of the first wire 3 and/or third wires 17. In such a configuration, even when a material with a high resistivity is used for the conductive layer 8, a time when a signal travels through the second wires 11 can be reduced, and a potential drop in the second wires 11 can be reduced. Thereby, as the material of the conductive layer 8, an electrode material (tantalum, tantalum nitride, titanium, titanium nitride, tungsten, or platinum) which is suitable for a diode function can be flexibly selected. In addition, it is possible to prevent a delay of signals in a wire between a circuit for driving a cross-point memory and a memory cell, or deficiency of voltages applied to the memory cell which would otherwise occur due to wire resistance.

The second wire 11 may include a layer in addition to the first semiconductor layer 7, the conductive layer 8 and the second semiconductor layer 10. Each of the first semiconductor layer 7, the conductive layer 8 and the second semiconductor layer 10 may have a plurality of layers.

In the configuration in which the longitudinal length of the second wires 11 is shorter than the longitudinal length of the first wires 3 and/or third wires 17, the thickness of the second wires 11 may be smaller than the thickness of the first wires 3 and the thickness of the third wires 17. For example, the first wires 3 and the third wires desirably have thicknesses of about 100 nm~500 nm which allows the wires to work well. In contrast, the second wires 11 is required to serve as at least the electrode of the diode elements. The conductive layer 8 which serves as both the upper electrode of first diode elements and the upper electrode of second diode elements desirably has a thickness in a range of 10 nm~50 nm. The semiconductor layer 7 of first diode elements and the semiconductor layer 10 of second diode elements desirably have thicknesses in a range of 3~15 nm. From the above, the second wires 11 desirably have a thickness in a range of 16~80 nm. In such a configuration, the thickness of the second wires 11 can be made extremely small. This makes it easy to perform patterning by processing and polishing. For example, when the second wires 11 are formed by etching, the processing easily completes before the resist has been etched away. In other words, the electrode material (tantalum, tantalum nitride, titanium, titanium nitride, tungsten, or platinum), which is suitable for the diode function, can be flexibly selected, even though these materials are processed and polished with difficulty.

In the above configuration, the wire resistance of the first wires 3 and the wire resistance of the third wires 17 may be set lower than the wire resistance of the second wires 11. At least one of the electric resistivity of the material forming the first wires and the electric resistivity of the material forming the third wires may be lower than the electric resistivity of the material forming the second wires. The first wires 3 and the third wire 17 are desirably each composed of the conductive layer made of a material with a low electric resistivity such as copper or aluminum, or a structure in which a barrier metal such as titanium nitride, titanium, tantalum nitride, or tantalum is stacked to underlie the conductive layer. By using these materials and structures, the wire resistance of the first wires 3 and the wire resistance of the third wires 17 can be made lower than the wire resistance of the second wires 11. Thus, it is possible to prevent a delay of signals in a wire between a circuit for driving a cross-point memory and the memory cell, or deficiency of voltages applied to a memory cell which would otherwise occur due to wire resistance. Besides, it is possible to achieve a high-speed operation of the cross-point memory.

(Embodiment 2)

Figure 3:
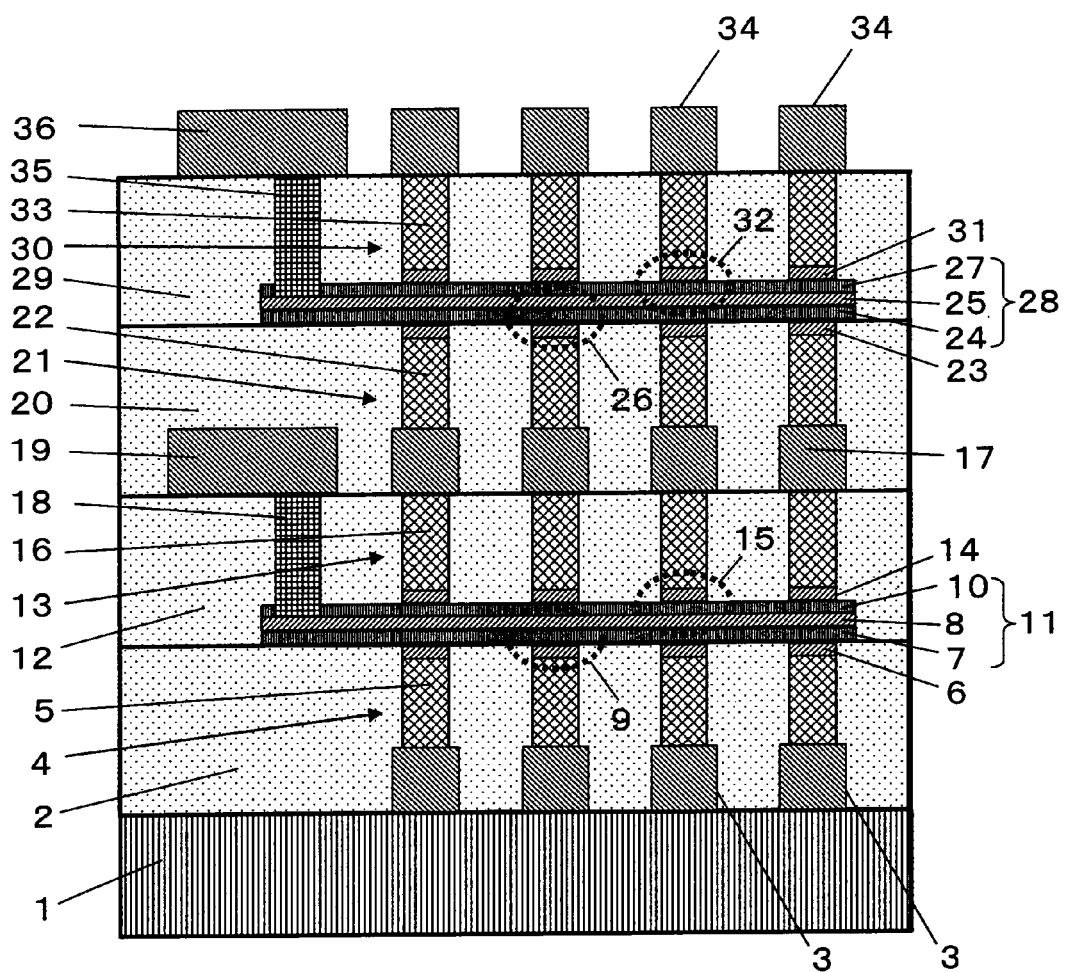
FIG. 3 is a cross-sectional view of a structure of a cross-point memory having a four-layer structure according to Embodiment 2 of the present invention.

FIG. 3 is a cross-sectional view showing an exemplary schematic configuration of a cross-point nonvolatile memory device having a four-layer structure according to Embodiment 2 of the present invention, as viewed from the side. Embodiment 2 is different from Embodiment 1 in that cross-point memory structures (constituent units each composed of constituents similar to the first interlayer insulating layer 2, the first through-holes 4, the first resistance variable layers 5, the first electrode layers 6, the second wires 11, the second interlayer insulating layer 12, the second through-holes 13, the second electrode layers 14, the second resistance variable layers 16 and the third wires 17 in FIG. 1) are stacked together on the third wires 17. In a stacked structure, each uppermost wire (upper electrode of the upper resistance variable elements) of cross-point memories in lower two layers and each lowermost wire (lower electrode of the lower resistance variable elements) of the upper cross-point memory are a common constituent. In FIGS. 1 and 3, the same constituents are designated by the same reference numerals and will not be described repetitively.

To be specific, the nonvolatile memory device is configured to, in addition to the constituents of Embodiment 1, include on the third wires 17, a third interlayer insulating layer 20, fourth wires 28 of a stripe shape which are formed on the third interlayer insulating layer 20 such that the fourth wires 28 respectively cross the third wires 17 perpendicularly to the third wires 17, a fourth interlayer insulating layer 29 formed over the third interlayer insulating layer 20 to cover the fourth wires 28, and fifth wires 34 of a stripe shape which are formed on the fourth interlayer insulating layer 29. Since the third interlayer insulating layer 20, the fourth interlayer insulating layer 29 and the fifth wires 34 are similar in configuration to the first interlayer insulating layer 2, the second interlayer insulating layer 12 and the first wires 3 (or third wires 17), they will not be described in detail respectively.

Third through-holes 21 (memory cell holes) are formed in regions of the third interlayer insulating layer 20 where the third wires 17 respectively cross the fourth wires 28 perpendicularly to the fourth wires 28. Inside each third through-hole 21, a third resistance variable layer 22 is formed such that the third resistance variable layer 22 is connected to the third wires 17, and a third electrode layer 23 is formed on the third resistance variable layer 22. Fourth through-holes 30 (memory cell holes) are formed in regions of the fourth interlayer insulating layer 29 where the fourth wires 28 cross the fifth wires 34 perpendicularly to the fifth wires 34, respectively. Inside each fourth through-hole 30, a fourth electrode layer 31 is formed such that the fourth electrode layer 31 is connected to the fourth wires 28 and a fourth resistance variable layer 33 is formed on the fourth electrode layer 31. Since the third through-holes 21 and their internal structure are similar to the first through-holes 4 and their internal structure, they will not be described in detail respectively. Since the fourth through-holes 30 and their internal structure are similar to the second through-holes 13 and their internal structure, they will not be described in detail respectively.

Each fourth wires 28 are composed of the third semiconductor layer 24 (semiconductor layer of third diode elements 26), a conductive layer 25 and a fourth semiconductor layer 27 (semiconductor layer of fourth diode elements 32) which are stacked together in this order. Since the fourth wires 28 are similar in structure to the second wires 11, it will not be described in detail repetitively.

The conductive layer 25 serves as the upper electrode of the third diode elements 26, the lower electrode of the fourth diode elements 32 and the conductive layer of the fourth wires 28.

Each third diode elements 26 (MSM diodes) are composed of the third electrode layer 23, the third semiconductor layer 24 and the conductive layer 25. Since the third diode elements 26 are similar in specific structure to the first diode elements 9, it will not be described in detail repetitively.

Each fourth diode elements 32 (MSM diodes) are composed of the conductive layer 25, the fourth semiconductive layer 27, and the fourth electrode layer 31. Since the fourth diode elements 32 are similar in specific structure to the second diode elements 15, it will not be described in detail repetitively.

The third diode elements 26 and the fourth diode elements 32 are vertically symmetric with respect to the fourth wires 28. Each fourth wires 28 is connected to a second lead-out wires 36 via a second lead-out contact plugs 35 penetrating the fourth interlayer insulating layer 29. Since the second lead-out contact plugs 35 are similar in specific structure to the first lead-out contact plugs 18, it will not be described in detail repetitively. Since the second lead-out wires 36 are similar in specific structure to the first lead-out wires 19, it will not be described in detail repetitively.

In the above described four-layer cross-point memory structure according to this Embodiment as described above, the wire layers having a diode function are only two layers which are the wire layers 11 and 28. Thus, the wire layers having a diode function can be reduced to about a half. In other words, as the remaining wires, wire layers which are used in a standard LSI process may be provided. Therefore, it is possible to achieve a nonvolatile memory device which can ensure a sufficient current supply capability in a cross-point configuration having a combination of the diode element and the resistance variable element and which has a large capacity while lessening complexity of the process and an increase in the process cost.

Since the third diode elements 26, the fourth diode elements 32, the third interlayer insulating layer 20, the fourth interlayer insulating layer 29, the third resistance variable layer 22, the fourth resistance variable layer 33 and the second lead-out contact plugs 35 are similar in specific configuration to those described in Embodiment 1, they will not be described in detail repetitively.

(Embodiment 3)

Figure 4:
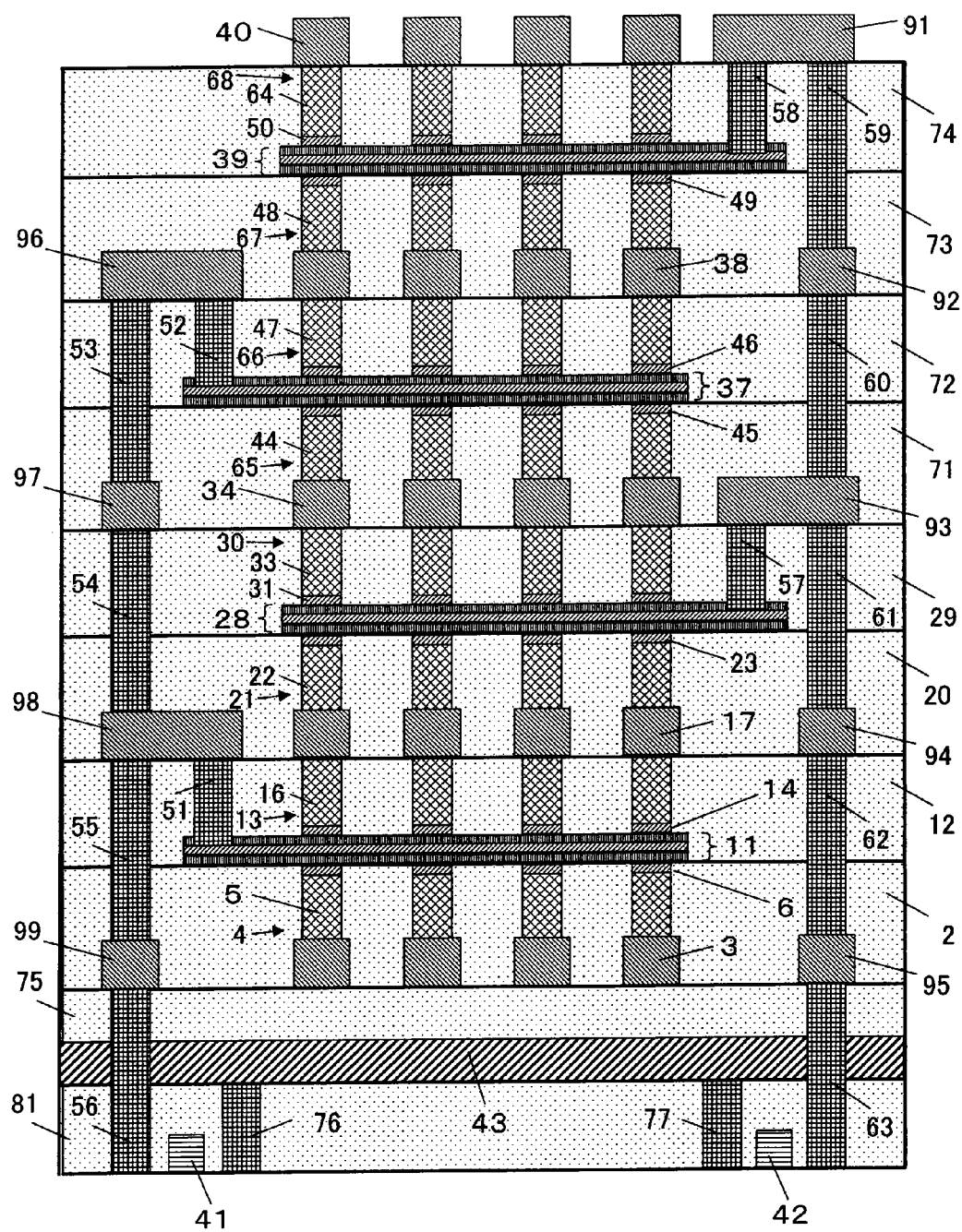
FIG. 4 is a cross-sectional view of a structure of an eight-layer cross-point memory having a hierarchical bit line architecture according to Embodiment 3 of the present invention.

FIG. 4 is a cross-sectional view showing an exemplary schematic configuration of a nonvolatile memory device having an eight-layer cross-point configuration and a hierarchical bit line architecture according to Embodiment 3 of the present invention, as viewed from the side. In Embodiment 3, the structure of Embodiment 1 is formed into a multi-layer structure and is applied to a hierarchical bit line architecture. In FIGS. 1 and 4, the same constituents are designated by the same reference numerals and will not be described repetitively.

As used herein, the hierarchical bit line architecture refers to an array configuration in which the bit lines have a hierarchical structure consisting of a global bit line (main bit line) and sub-bit lines and memory cells are connected in parallel with the sub-bit lines, respectively. The hierarchical bit line architecture is directed to individually driving divided units to provide an improved read operation margin and a higher-speed read operation which are adapted for a large-sized array mat. Since the detailed structure is similar to that described in Embodiment 1, it will not be described repetitively. In FIG. 4, reference numerals 71, 72, 73 and 74 designate fifth to eighth interlayer insulating layers, respectively, and reference numerals 51~63 designate lead-out contact plugs, respectively. Also, 75 designates an interlayer insulating layer, and 76 and 77 designate lead-out contact plugs. 43 designates the global bit line for connecting the bit lines in the respective layers each other. A substrate which is not shown is provided under the interlayer insulating layer 75.

A fifth through-holes 65, a sixth through-holes 66, a seventh through-holes 67, an eighth through-holes 68 and their internal structures are similar in configuration to the first through-holes 4, the second through-holes 13, the third through-holes 21, the fourth through-holes 30 and their internal structures, respectively.

A fifth resistance variable layer 44, a sixth resistance variable layer 47, a seventh resistance variable layer 48 and an eighth resistance variable layer 64 are similar in configuration to the first resistance variable layer 5, the second resistance variable layer 16, the third resistance variable layer 22 and the fourth resistance variable layer 33, respectively.

A fifth electrode layer 45, a sixth electrode layer 46, a seventh electrode layer 49 and an eighth electrode layer 50 are similar in configuration to the first electrode layer 6, the second electrode layer 14, the third electrode layer 23 and the fourth electrode layer 31, respectively.

Sixth wires 37, seventh wires 38, eighth wires 39 and ninth wires 40 are similar in configuration to the second wires 11, the third wires 17, the fourth wires 28, and the fifth wires 34, respectively.

In the configuration of the nonvolatile memory device of this Embodiment, as shown in FIG. 4, the first wires 3, the third wires 17, the fifth wires 34, the seventh wires 38 and the ninth wires 40 extend in X-direction (direction perpendicular to the sheet of the drawing) and operate as word lines (activate the memory cells to place them into a state where writing and reading of data are enabled, to be specific, when a decoder circuit is connected to the word lines and selects a word line (applies voltages), the memory cell connected to the word line is activated). In contrast, the second wires 11, the fourth wires 28, the sixth wires 37 and the eighth wires 39 into which the diode elements of the upper and lower memory cells are integrated extend in Y-direction (lateral direction in the drawing) and operate as bit lines (sub-bit lines) (operate as data lines used for writing and reading data to and from the memory cells, a sense amplifier circuit is connected to the bit lines and amplifies the potentials of bit lines, and data are processed as digital data). The bit lines are arranged so as to overlap with each other in Z-direction (stacking direction) (the bit lines belonging to the respective constituent units overlap with each other when viewed in the thickness direction). Bit lines overlapping with each other when viewed in the thickness direction, from among the fourth wires 28 and the eighth wires 39 which are bit lines in even-numbered layers ((even-number)-th constituent units from the substrate) are connected to each other (electrically connected to each other by electrode layers) via lead-out contact plugs 57~63 and lead-out wires 91~95 and are connected to each FET transistor connected to the global bit line 43 via a lead-out contact plugs 77. A select switch 42 is a gate electrode of each FET transistor. In other words, each FET transistor is constituted by the substrate (not shown) and the select switch 42. Bit lines overlapping with each other when viewed in the thickness direction, from among the second wires 11 and the sixth wires 37 which are bit lines in odd-numbered layers ((odd-number)-th constituent units from the substrate) are connected to each other (electrically connected to each other by electrode layers) via lead-out contact plugs 51~56 and lead-out wires 96~99 and are connected to each FET transistor connected to the global bit line 43 via a lead-out contact plugs 76. A select switch 41 is a gate electrode of the FET transistor. In other words, each FET transistor is constituted by the substrate (not shown) and the select switch 41.

Although the lead-out contact plugs 56 and 63 cross the global bit line 43 in FIG. 4, they are insulated from each other in cross sections actually.

In such a configuration, the memory cells are formed at cross-points (three-dimensional cross-points) where the word lines extending in X-direction and formed in a plurality of layers respectively cross the bit lines each of which extends in Y-direction and is located in the layer between the associated word lines, and a plurality of basic array planes including common word lines are arranged in Y-direction for each group of bit lines aligned in Z-direction. In other words, a multi-layer cross-point structure is formed. In the respective basic array planes, the bit lines in the even-numbered layers are connected to each other and the bit lines in the odd-numbered layers are connected to each other. By combining the select switch elements with the bit lines in the even-numbered layers which are connected to each other and the bit lines in the odd-numbered layers which are connected to each other, switching between electric connection and disconnection to the global bit line connected to the select switches is controlled. Thus, a hierarchical bit line architecture is achieved. This makes it possible to attain a nonvolatile memory device which can reduce an array size without substantially increasing a layout area.

Since the bit lines are divided, which is a feature of the hierarchical bit line architecture, i.e., the bit lines are formed to have a hierarchical structure consisting of the global bit line (main bit line) having a large length and sub-bit lines having a short length, and the sub-bit lines are arranged in the respective array planes, the length of the bit lines in the respective array planes is reduced. By reducing the wire layers having a diode function and the sub-bit lines to a common constituent, wire layers having a conductivity with a lower resistivity may be used as the remaining word lines having a large length, because the word lines need not serve as the electrodes of the diodes. This makes it possible to prevent a wire delay with respect to a circuit for driving a cross-point memory and a drop of the voltages applied to the memory cell and to achieve a high-speed operation of the memory.

(First Manufacturing Method of Embodiment 1)

Figure 5:
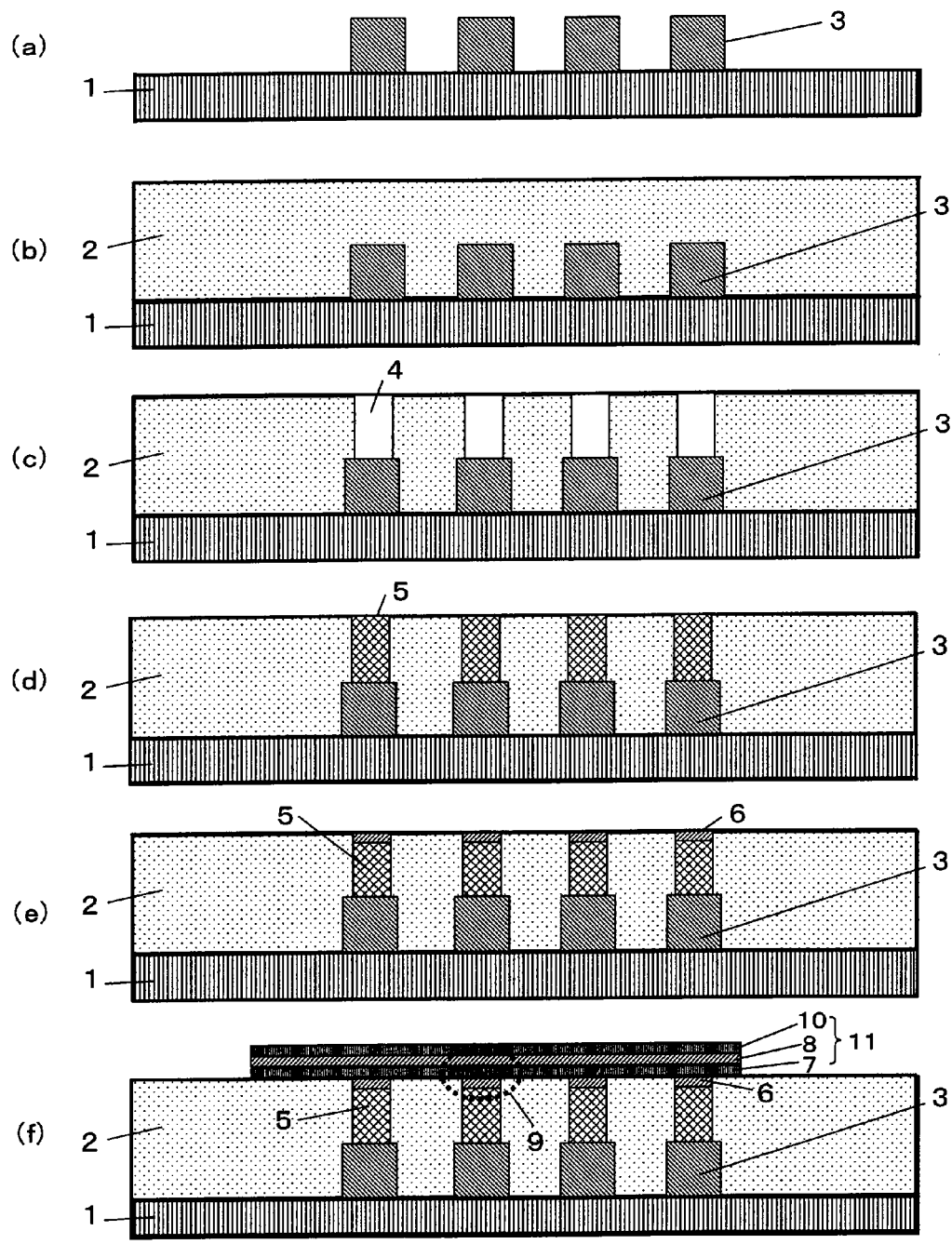
FIG. 5 is a process step cross-sectional view for explaining a first manufacturing method of the cross-point memory having a two-layer structure according to Embodiment 1 of the present invention, in which FIG. 5($a$) is a view showing a step for forming first wires on a substrate, FIG. 5($b$) is a view showing a step for forming a first interlayer insulating layer, FIG. 5($c$) is a view showing a step for forming a plurality of first through-holes in the first interlayer insulating layer, FIG. 5($d$) is a view showing a step for filling first resistance variable layers into the first through-holes, respectively, FIG. 5($e$) is a view showing a step for filling first electrode layers into the first through-holes, respectively, and FIG. 5($f$) is a view showing a step for forming second wires.
Figure 6:
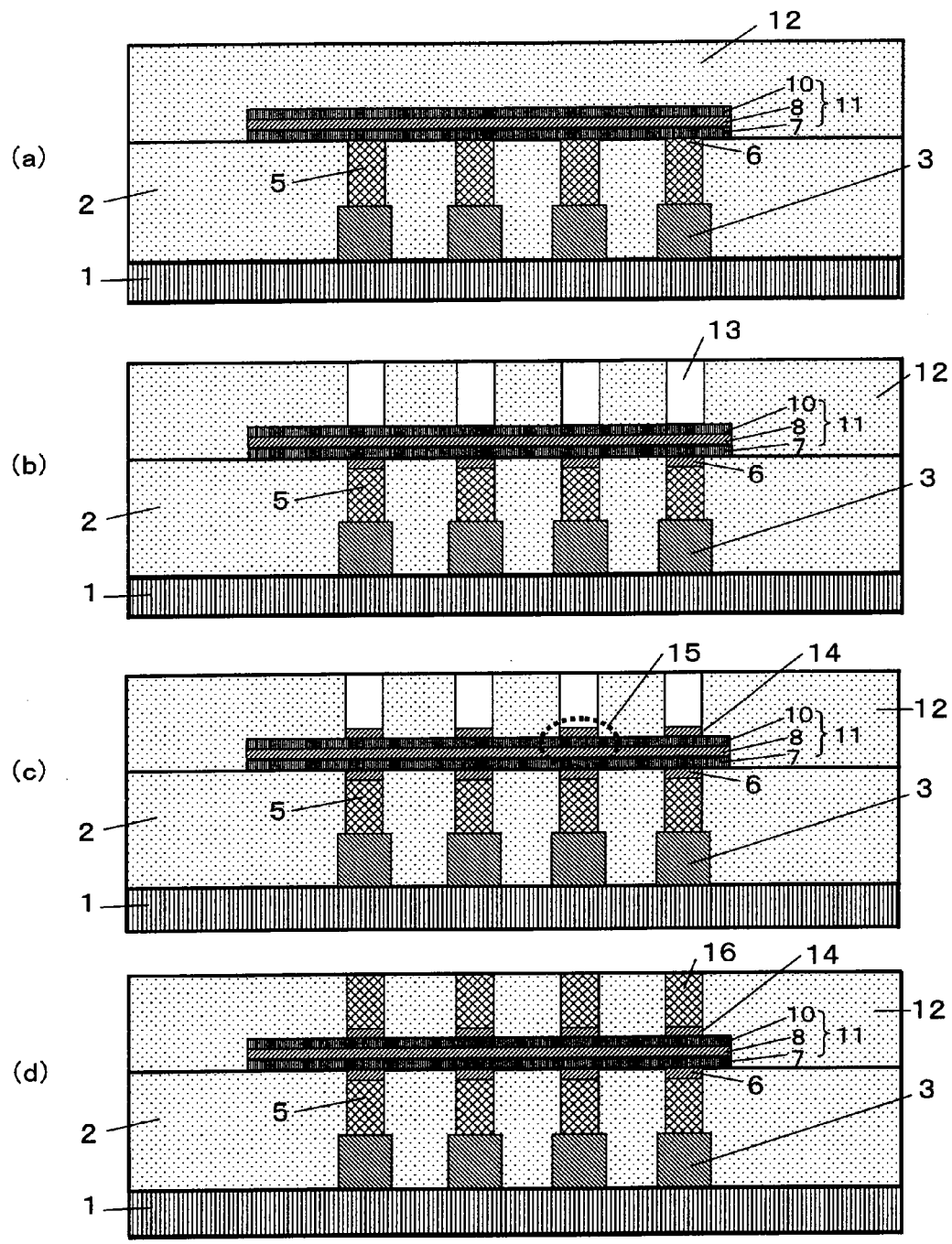
FIG. 6 is a process step cross-sectional view for explaining a first manufacturing method of the cross-point memory having a two-layer structure according to Embodiment 1 of the present invention, in which FIG. 6($a$) is a view showing a step for forming a second interlayer insulating layer, FIG. 6($b$) is a view showing a step for forming second through-holes, FIG. 6($c$) is a view showing a step for filling second electrode layers into the second through-holes, respectively, and FIG. 6($d$) is a view showing a step for filling second resistance variable layers into the second through-holes, respectively.
Figure 7:
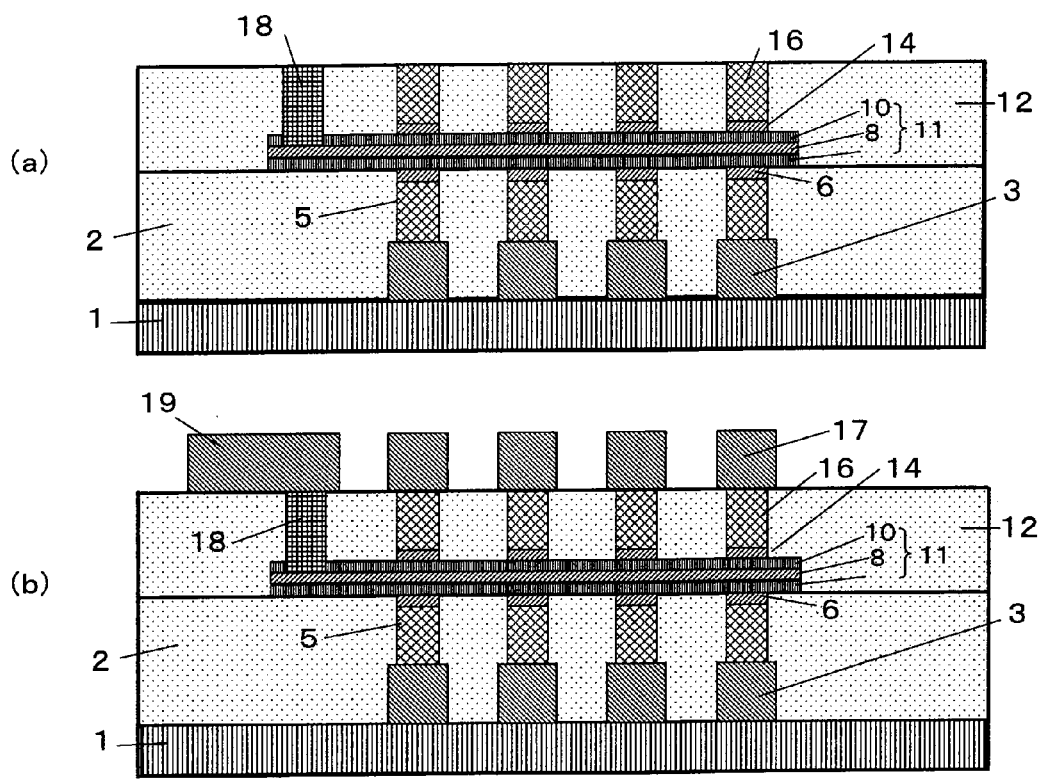
FIG. 7 is a process step cross-sectional view for explaining a first manufacturing method of the cross-point memory having a two-layer structure according to Embodiment 1 of the present invention, in which FIG. 7($a$) is a view showing a step for forming first lead-out contact plugs, and FIG. 7($b$) is a view showing a step for forming third wires and first lead-out wires.

Subsequently, a first manufacturing method of the nonvolatile memory device according to Embodiment 1 of the present invention will be described with reference to FIGS. 5 to 7.

FIG. 5(a) is a cross-sectional view showing a step for forming the first wires 3 of a stripe shape by patterning using a desired mask (sputtering, and etching using a mask) on the substrate 1. In this Embodiment, the first wires 3 is composed of aluminum as major component. The wires are formed in a "stripe shape" means that a plurality of wires are formed to respectively extend in parallel with each other and in a predetermined direction. In this step, a plurality of first wires 3 are formed on the substrate 1 to extend in parallel with each other and in a first direction.

Then, as shown in FIG. 5(b), the first interlayer insulating layer 2 is formed over the entire surface of the substrate 1 by sputtering to cover the substrate 1 and the first wires 3 located thereon, and its surface is planarized by CMP. Fluorine-containing silicon oxide (e.g., SiOF) or carbon-containing silicon nitride (e.g., SiCN) is suitably used as the material of the first interlayer insulating layer 2 to reduce a parasitic capacitance between wires.

Then, as shown in FIG. 5(c), the first through-holes 4 are formed at constant arrangement pitch (interval) along the direction (direction perpendicular to the sheet of FIG. 8(c)) in which the first wires 3 extend, by patterning (etching) using a desired mask such that the first through-holes 4 penetrate the first interlayer insulating layer 2 on the first wires 3 and reach the first wires 3. If the width of the first wires 3 is smaller than the size of the first through-holes 4, the contact area of the first wires 3 and the first resistance variable layer 5 changes due to misalignment between masks, causing a change in a cell current, for example. To prevent this, the width (width in a rightward and leftward direction in FIG. 5(c): lateral width with the longitudinal direction of the first wires 3 being a forward and rearward direction) of the first wires 3 is larger than the width (width in a rightward and leftward direction in FIG. 5(c): lateral width with the longitudinal direction of the first wires 3 being a forward and rearward direction) of the lower openings of the first through-holes 4. Thereby, each first wire 3 covers the entire surfaces of the lower openings of the first through-holes 4 and protrudes outward over the periphery thereof.

Then, as shown in FIG. 5(d), the first resistance variable layers 5 are filled into the first through-holes 4, respectively. As the first resistance variable layers 5, tantalum oxide may be deposited by sputtering process. As the layer forming method, a CVD process, an ALD process, or the like may be used, instead of the sputtering. The first resistance variable layers 5 are filled into the first through-holes 4 by the CMP process or an etch-back process.

Then, as shown in FIG. 5(e), by conducting overpolishing or an etch-back process, a portion of the first resistance variable layer 5 inside each first through-hole 4 is removed. Then, the first electrode layer 6 is filled into the upper portion of each first through-hole 4. As the material of the first electrode layer 6, tantalum nitride may be used. The layer of tantalum nitride may be deposited by the sputtering process as in the above described tantalum oxide. The layer of tantalum nitride may be filled into each first through-hole 4 by using the CMP process or the etch-back process.

Then, as shown in FIG. 5(f), the second wires 11 of a stripe shape are formed, each of which includes the first semiconductor layer 7, the conductive layer 8 and the second semiconductor layer 10 which are stacked together in this order. To be specific, in this step, the plurality of second wires 11 are formed on the first interlayer insulating layer 2 to extend in parallel with each other and in a second direction crossing the first direction when viewed in the thickness direction of the first interlayer insulating layer. The second wires 11 are formed using a desired mask such that the second wires 11 physically contact the first electrode layer 6 and three-dimensionally cross the first wires 3, respectively (for example, perpendicularly to the first wires 3). To be specific, a material of the first semiconductor layer 7, a material of the conductive layer 8, and a material of the second semiconductor layer 10 are deposited by sputtering and then etched using a mask, thereby forming the semiconductor wires 11 of a desired shape. In this case, the second wires 11 are formed to cover the entire upper end surface of each first electrode layer 6 and to protrude outward over the periphery of the entire upper end surface. The width (width perpendicular to the sheet of FIG. 5(f): lateral width with the longitudinal direction of the second wires 11 being the forward and rearward direction) of the second wires 11 is larger than the width (width perpendicular to the sheet of FIG. 5(f): lateral width with the longitudinal direction of the second wires 11 being the forward and rearward direction) of the upper openings of the first through-holes 4.

In this Embodiment, tantalum nitride may be used for the first electrode layer 6 and the conductive layer 8, and SiN may be used for the first semiconductor layer 7 and the second semiconductor layer 10. SiN is deposited by a sputtering process, a CVD process or an ALD process. Thereby, it is possible to form a thin layer which has a good insulative property and is dense. In this way, the first diode elements 9 (MSM diodes) are formed.

Then, as shown in FIG. 6(a), the second interlayer insulating layer 12 is deposited over the first interlayer insulating layer 2 to cover the first interlayer insulating layer 2 and the second wires 11 thereon. The second interlayer insulating layer 12 may be formed by using the material and method for the first interlayer insulating layer 2.

Then, as shown in FIG. 6(b), the second through-holes 13 are formed at constant arrangement pitch (interval) along the direction (rightward and leftward direction in FIG. 6(b)) in which the second wires extend, by patterning using a desired mask such that the second through-holes 13 penetrate the second interlayer insulating layer 12 on the second wires 11 and reach the second wires 11. For a similar reason for the first through-holes 4, the width (width perpendicular to the sheet of FIG. 6(b): lateral width with the longitudinal direction of the second wires 11 being the forward and rearward direction) of the second wires 11 is larger than the width (width perpendicular to the sheet of FIG. 6(b): lateral width with the longitudinal direction of the second wires 11 being the forward and rearward direction) of the lower openings of the second through-holes 13. In this way, the second wires 11 (second semiconductor layer 10) cover the entire surfaces of the lower openings of each second through-holes 13 and protrudes outward over the entire surfaces. It is desired that the second through-holes 13 be respectively positioned right above the associated first through-holes 4, to achieve miniaturization of the cell layout and maintain symmetric property between the upper and lower cells of the cross-point memory, thereby suppressing a variation in a circuit operation.

Then, as shown in FIG. 6(c), the second electrode layers 14 are filled onto the lower surfaces of the second through-holes 13, respectively, by a CMP process, or an etch-back process. In this way, each second diode elements 15 (MSM diodes) are formed to include the conductive layer 8, the second semiconductor layer 10 and the second electrode layer 14. The first diode elements 9 and the second diode elements 15 are formed symmetrically to sandwich the second wires 11.

Then, as shown in FIG. 6(d), the second resistance variable layers 16 are filled onto the second electrode layers 14 inside second through-holes 13, respectively. The forming method of these constituents is described with reference to FIG. 5(d) and will not be described repetitively.

Then, as shown in FIG. 7(a), the first lead-out contact plugs 18 are formed such that each contact plugs 18 penetrates the second interlayer insulating layer 12 and is connected to the second wires 11. The first lead-out contact plugs 18 is made of tungsten or copper, or has a stacked structure which is a combination of tungsten or copper and titanium, titanium nitride, tantalum or tantalum nitride filled under the tungsten or the copper. The first lead-out contacts 18 penetrate the semiconductor layer 10 of second diode elements and are connected to the conductive layer 8 of second wires, to form an ohmic contact and to prevent the contact from failing to function.

Finally, as shown in FIG. 7(b), by patterning using a desired mask (sputtering, and etching using a mask), the third wires 17 of a stripe shape and the first lead-out wires 19 are formed. To be specific, in this step, the plurality of third wires 17 are formed on the second interlayer insulating layer 12 to extend in parallel with each other in a third direction crossing the second direction when viewed in the thickness direction of the second interlayer insulating layer, and concurrently, the first lead-out wires 19 are formed. The third wires 17 are formed to physically contact the second resistance variable layer 16 and three dimensionally-cross the second wires 11 (e.g., perpendicularly to the second wires 11), respectively. In this case, the third wires 17 are formed to cover the entire surfaces of the upper openings (upper end surfaces of the second resistance variable layer 16) of the second through-holes 13 and to protrude outward over the periphery of the entire surfaces of the upper openings. The width (width in a rightward and leftward direction in FIG. 7(b): lateral width with the longitudinal direction of the third wires 17 being a forward and rearward direction) of the third wires 17 is larger than the width (width in a rightward and leftward direction in FIG. 7(b): lateral width with the longitudinal direction of the third wires 17 being a forward and rearward direction) of the upper openings of the second through-holes 13. The first lead-out wires 19 are connected to the first lead-out contact plugs 18. After that, an insulating protective layer (not shown) is formed, thereby manufacturing the nonvolatile memory device of Embodiment 1 of the present invention as shown in FIG. 1.

(Second Manufacturing Method of Embodiment 1)

Figure 8:
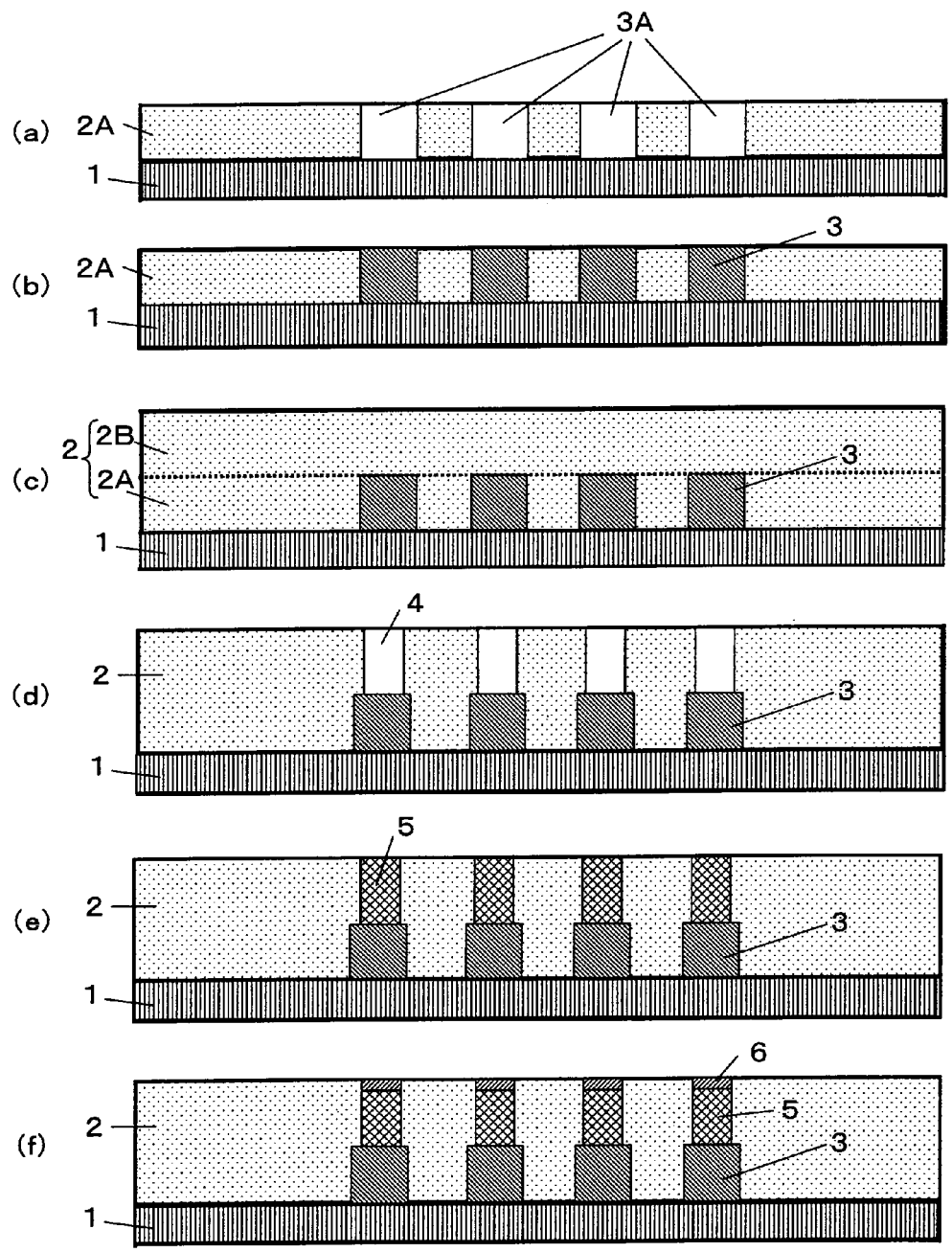
FIG. 8 is a process step cross-sectional view for explaining a second manufacturing method of the cross-point memory having a two-layer structure according to Embodiment 1 of the present invention, in which FIG. 8($a$) is a view showing a step for forming a first interlayer insulating layer and trenches on a substrate, FIG. 8($b$) is a view showing a step for forming first wires by a damascene process, FIG. 8($c$) is a view showing a step for forming a first interlayer insulating layer, FIG. 8($d$) is a view showing a step for forming a plurality of first through-holes in the first interlayer insulating layer, FIG. 8($e$) is a view showing a step for filling first resistance variable layers into the first through-holes, respectively, and FIG. 8($f$) is a view showing a step for filling first electrode layers into the first through-holes, respectively.
Figure 9:
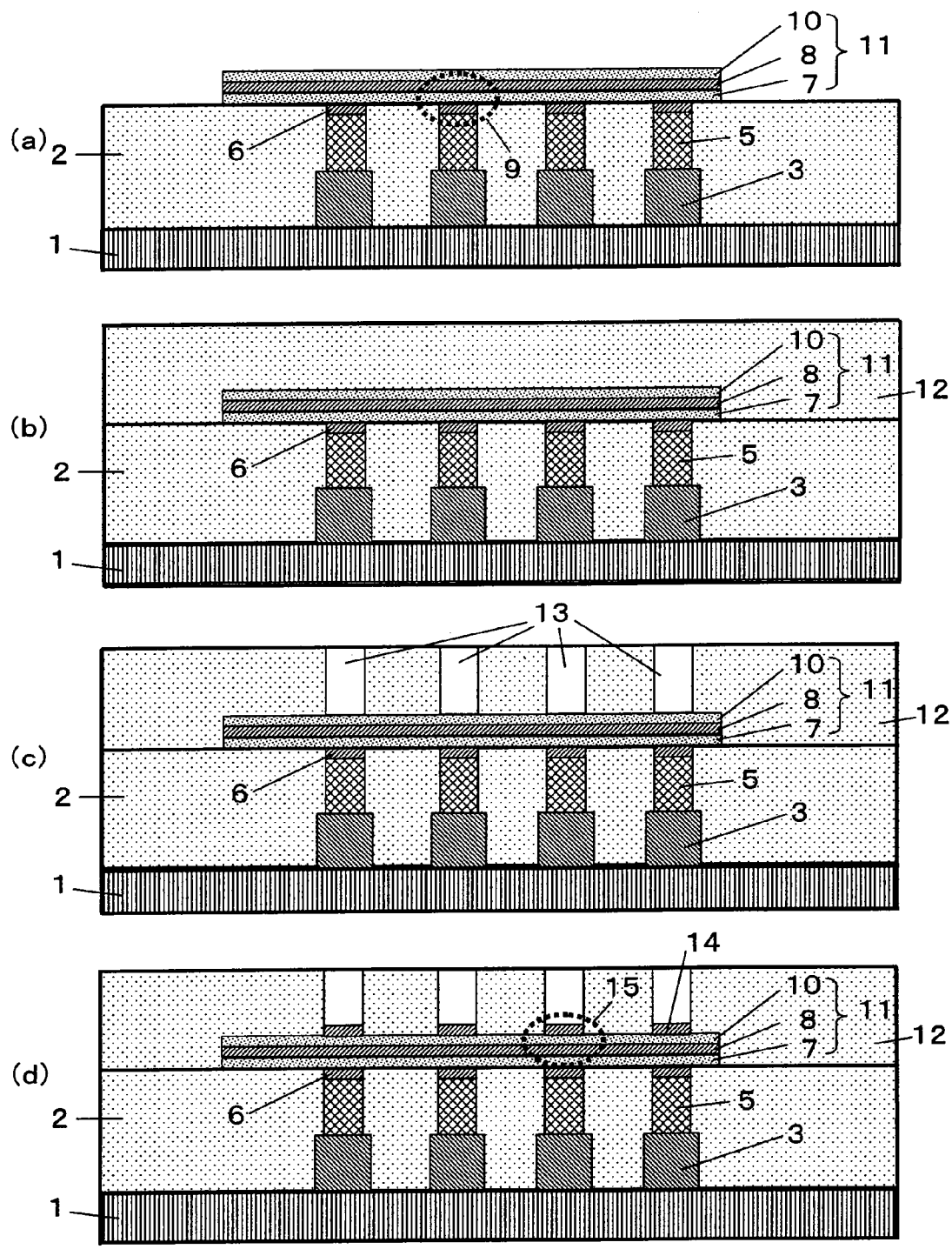
FIG. 9 is a process step cross-sectional view for explaining a second manufacturing method of the cross-point memory having a two-layer structure according to Embodiment 1 of the present invention, in which FIG. 9($a$) is a view showing a step for forming second wires.
Figure 10:
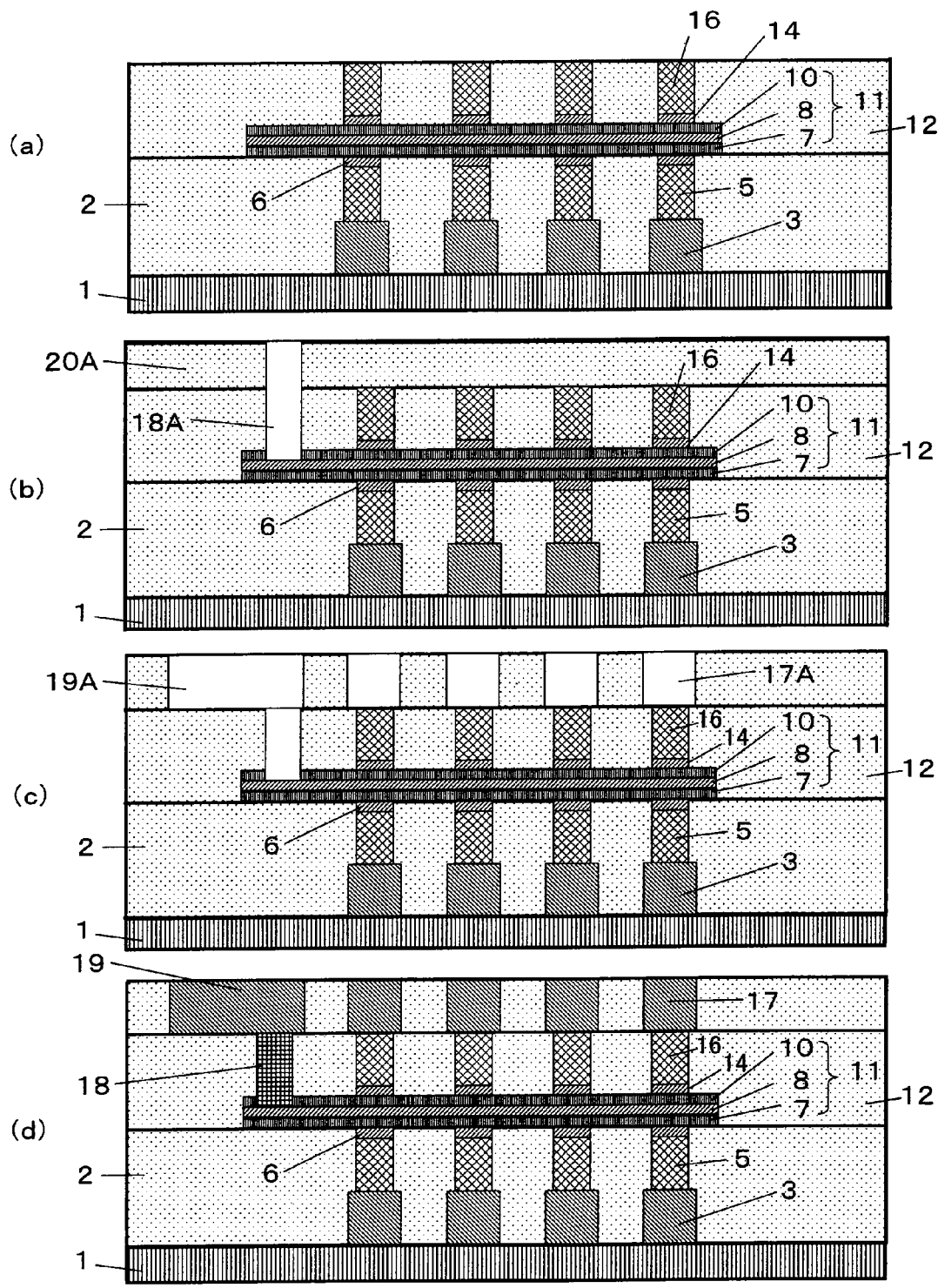

Subsequently, a second manufacturing method of the nonvolatile memory device according to Embodiment 1 of the present invention will be described with reference to FIGS. 8 to 10. Since the steps from the step in FIG. 8(d) which is a step for forming the first through-holes 4 in the first insulating layer 2 to the step in FIG. 10(a) which is a step for filling the second resistance variable layer 16 into the second through-holes 13 are similar to those shown in FIGS. 5(c) to 6(d), they will not be described repetitively. In addition, since the materials and others of the wires, the interlayer insulating layers, the resistance variable layers, the diode elements, and the contacts are similar to those described in the specific configuration of the first manufacturing method of Embodiment 1 of the present invention, they will not be described repetitively.

FIG. 8(a) is a cross-sectional view showing a step for forming trenches 3A into which the first wires 3 will be filled in predetermined positions of a first interlayer insulating layer 2A after forming the first interlayer insulating layer 2A over the entire surface of the substrate 1. This step is implemented by conducting etching using a desired mask after the first interlayer insulating layer 2A is deposited by sputtering.

Then, as shown in FIG. 8(b), after forming a conductive layer which becomes the first wires 3, the first wires 3 are formed in a damascene process using a CMP. The material of the first wires 3 contains as major component Cu which a has lower resistance, is adapted for miniaturization and has been already introduced in a state-of-the-art LSI process.

Then, as shown in FIG. 8(c), a first interlayer insulating layer 2B is formed over the entire upper end surfaces of the first wires 3 and the entire upper end surface of the first interlayer insulating layer 2A by sputtering so as to cover the first wires 3.

The steps shown in FIGS. 8(d)~FIG. 10(a) are similar to the steps shown in FIGS. 5(c)~6(d) described in Embodiment 1. It should be noted that the second wires 11 are formed by etching using a desired mask. In a case where each second wires 11 has a stacked structure in which the plural constituents of the diode elements are integrated into (formed integrally with) the second wires 11, and the second wires 11 can be thinned, a pattern is formed by etching adapted for miniaturization.

Then, as shown in FIG. 10(b), a third interlayer insulating layer 20A is formed over the second interlayer insulating layer 12 by sputtering to cover the second through-holes 13, and then, holes 18A into which the first lead-out contact plugs penetrating the second interlayer insulating layer 12 and the third interlayer insulating layer 20A are filled, are formed by etching using a mask. The holes 18A into which the first lead-out contact plugs are filled are formed such that each hole 18A penetrates the second semiconductor layer 10 to expose the conductive layer 8 of second wires, to form an ohmic contact and to prevent the contact from failing to function.

Then, as shown in FIG. 10(c), trenches 17A into which the third wires 17 will be filled, respectively and trenches 19A into which the first lead-out wires 19 will be filled, respectively, are formed in predetermined positions of the third interlayer insulating layer 20A, by etching using a mask. Each trench 17A is formed to expose the entire upper end surface of the second resistance variable layer 16 in each second through-hole 13, while each trench 19A is formed to contain the entire upper end surface of the each hole 18A into which the each first lead-out contact plug 18 will be filled.

Finally, as shown in FIG. 10(d), after forming a conductive layer which becomes the third wires 17 and the first lead-out wires 19, the trenches 17A and 19A and the holes 18A are filled with the materials by a damascene process using CMP. In this way, the third wires 17, the first lead-out contact plugs 18, and the first lead-out wires 19 are formed. The materials of the wires (third wires 17, first lead-out contact plugs 18 and first lead-out wires 19) may contain as major component Cu which has a lower resistance, is adapted for miniaturization and has been already introduced into a state-of-the-art LSI. After that, an insulating protective layer (not shown) is formed, thereby manufacturing the nonvolatile memory device of Embodiment 1 of the present invention as shown in FIG. 1.

As should be readily appreciated, the cross-point nonvolatile memory device having a four-layer structure shown in FIG. 3 and the nonvolatile memory device having an eight-layer cross-point hierarchical bit line architecture shown in FIG. 4 are formed by stacking four layers and eight layers, by using the first manufacturing method or second manufacturing method as described above in the same manner. Therefore, the detailed manufacturing method and process step views for these cases will not be described in detail respectively.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention relates to a cross-point nonvolatile memory device including diode elements and resistance variable layers and implements a nonvolatile memory which has a very large memory capacity. Therefore, the present invention is useful in fields of various electronic hardware incorporating the nonvolatile memory device.

The invention claimed is:
1. A nonvolatile memory device comprising:
a substrate;
a plurality of first wires which are formed on the substrate and extend in parallel with each other in a first direction;
a first interlayer insulating layer formed over the substrate and the plurality of first wires;
a plurality of second wires which are formed on the first interlayer insulating layer and extend in parallel with each other in a second direction crossing the first direction when viewed in a thickness direction of the first interlayer insulating layer;
a second interlayer insulating layer which is formed over the first interlayer insulating layer and the plurality of second wires; and
a plurality of third wires which are formed on the second interlayer insulating layer and extend in parallel with each other in a third direction crossing the second direction when viewed in a thickness direction of the second interlayer insulating layer;
a plurality of first through-holes formed to penetrate the first interlayer insulating layer at three-dimensional cross points of the plurality of first wires and the plurality of second wires, respectively;
a plurality of second through-holes formed to penetrate the second interlayer insulating layer at three-dimensional cross points of the plurality of second wires and the plurality of third wires, respectively;
first nonvolatile memory elements; and
second nonvolatile memory elements, wherein:
each of the plurality of second wires has a stacked structure including a first semiconductor layer, a conductive layer and a second semiconductor layer which are stacked together in this order,
each of the first nonvolatile memory elements includes a first resistance variable layer and a first electrode layer which are stacked together in this order on an associated one of the plurality of first wires and inside an associated one of the plurality of first through-holes, each of the second nonvolatile memory elements includes a second electrode layer and a second resistance variable layer which are stacked together in this order on an associated one of the plurality of second wires and inside an associated one of the plurality of second through-holes and are connected to an associated one of the plurality of third wires, the first electrode layer, the first semiconductor layer and the conductive layer constitute each of first diode elements, the conductive layer, the second semiconductor layer and the second electrode layer constitute each of second diode elements, each of the first semiconductor layer of the plurality of second wires entirely covers an upper opening of each of the plurality of first through-holes and protrudes outward over the upper opening, and each of the second semiconductor layer of the plurality of second wires entirely covers a lower opening of each of the plurality of second through-holes and protrudes outward over the lower opening.

2. The nonvolatile memory device according to claim 1, comprising a plurality of constituent units being stacked together, each of the constituent units including the plurality of first wires, the first interlayer insulating layer, the first nonvolatile memory elements, the plurality of second wires, the second interlayer insulating layer and the second nonvolatile memory elements.

3. The nonvolatile memory device according to claim 2, wherein:
the plurality of first wires and the plurality of third wires have a word line function,
the plurality of second wires have a bit line function,
the plurality of second wires respectively belonging to the constituent units overlap with each other when viewed in a thickness direction,
second wires which belong to (even-number)-th constituent units from the substrate and overlap with each other when viewed in the thickness direction are electrically connected to each other, and
second wires which belong to (odd-number)-th constituent units from the substrate and overlap with each other when viewed in the thickness direction are electrically connected to each other.

4. The nonvolatile memory device according to claim 1, wherein a longitudinal length of each of the plurality of second wires is shorter than at least one of a longitudinal length of each of the plurality of first wires and a longitudinal length of each of the plurality of third wires.

5. The nonvolatile memory device according to claim 1, wherein a thickness of each of the plurality of second wires is smaller than at least one of a thickness of each of the plurality of first wires and a thickness of each of the plurality of third wires.

6. The nonvolatile memory device according to claim 1, wherein at least one of an electric resistivity of a material forming the plurality of first wires and an electric resistivity of a material forming the plurality of third wires is lower than an electric resistivity of a material forming the plurality of second wires.

7. The nonvolatile memory device according to claim 1, wherein:
each of the plurality of first wires entirely covers a lower opening of each of the plurality of first through-holes and protrudes outward over the lower opening, and
each of the plurality of third wires entirely covers an upper opening of each of the plurality of second through-holes and protrudes outward over the upper opening.

8. A method of manufacturing a nonvolatile memory device, the method comprising steps of:
forming a plurality of first wires on a substrate such that the first wires extend in parallel with each other in a first direction;
forming a first interlayer insulating layer over the substrate and the plurality of first wires;
forming a plurality of first through-holes on the first wires, respectively such that the first through-holes penetrate the first interlayer insulating layer and are arranged at predetermined intervals;
filling first resistance variable layer and first electrode layer into the plurality of first through-holes, respectively such that the first resistance variable layer and the first electrode layer are stacked in this order on each of the plurality of first wires;
forming a plurality of second wires on the first interlayer insulating layer such that the plurality of second wires extend in parallel with each other in a second direction crossing the first direction when viewed in a thickness direction of the first interlayer insulating layer, cover entire upper end surfaces of the first electrode layer, respectively, and protrude outward over the entire upper end surfaces, respectively, each of the plurality of second wires including a first semiconductor layer, a conductive layer, and a second semiconductor layer which are stacked together in this order, the first electrode layer, the first semiconductor layer and the conductive layer constituting each of first diode elements, the first semiconductor layer of each of the plurality of second wires covering entire upper end surfaces of the first electrode layer and protruding outward over the entire upper end surfaces;
forming a second interlayer insulating layer over the first interlayer insulating layer and the plurality of second wires;
forming a plurality of second through-holes on the plurality of second wires, respectively such that the second through-holes penetrate the second interlayer insulating layer and are arranged at predetermined intervals, each of the second semiconductor layer of the plurality of second wires entirely covering a lower opening of each of the second through-holes and protruding outward over the lower opening;
filling second resistance variable layers and second electrode layers into the plurality of second through-holes, respectively such that the second resistance variable layer and the second electrode layer are stacked in this order on each of the plurality of second wires, the conductive layer, the second semiconductor layer and the second electrode layer constituting each of second diode elements; and
forming a plurality of third wires on the second interlayer insulating layer such that the third wires extend in parallel with each other in a third direction crossing the second direction when viewed in a thickness direction of the second interlayer insulating layer and cover entire upper end surfaces of the second resistance variable layers, respectively.

9. The method of manufacturing the nonvolatile memory device according to claim 8, wherein:
the step for forming the first wires is performed by a damascene process in which wire material is filled into predetermined trenches by a CMP process after forming the trenches in the first interlayer insulating layer, the step for forming the plurality of second wires is performed in such a manner that the first semiconductor layer, the conductive layer and the second semiconductor layer are etched using a mask after the first semiconductor layer, the conductive layer and the second semiconductor layer are stacked together in this order, and the step for forming the plurality of third wires is performed by a damascene process in which wire material is filled into predetermined trenches by a CMP process after forming the trenches in the second interlayer insulating layer.

10. The method of manufacturing a nonvolatile memory device according to claim 8, wherein:

the step for forming the plurality of first through-holes includes a step for forming the plurality of first through-holes such that each of the plurality of first wires entirely covers a lower opening of each of the plurality of first through-holes and protrudes outward over the lower opening, and the step for forming the plurality of third wires includes a step for forming the plurality of third wires such that each of the plurality of third wires covers an entire upper end surface of each of the second resistance variable layers and protrudes outward over the entire upper end surface.

* * * * *